US012562334B2

(12) United States Patent
Beugin et al.

(10) Patent No.: US 12,562,334 B2
(45) Date of Patent: Feb. 24, 2026

(54) MULTI-BEAM CHARGED PARTICLE COLUMN

(71) Applicant: ASML Netherlands B.V., Veldhoven (NL)

(72) Inventors: Vincent Claude Beugin, Nootdorp (NL); Stijn Wilem Herman Karel Steenbrink, The Hague (NL); Martin Ebert, Fremont, CA (US); Diego Martinez Negrete Gasque, Delft (NL); Hindrik Willem Mook, The Hague (NL); Albertus Victor Gerardus Mangnus, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 390 days.

(21) Appl. No.: 18/117,373

(22) Filed: Mar. 3, 2023

(65) Prior Publication Data
US 2023/0207255 A1 Jun. 29, 2023

Related U.S. Application Data

(63) Continuation of application No. PCT/EP2021/072713, filed on Aug. 16, 2021.

(60) Provisional application No. 63/074,334, filed on Sep. 3, 2020.

(30) Foreign Application Priority Data

Oct. 8, 2020 (EP) .................................... 20200741

(51) Int. Cl.
*H01J 37/20* (2006.01)
*H01J 37/28* (2006.01)

(52) U.S. Cl.
CPC ............... *H01J 37/20* (2013.01); *H01J 37/28* (2013.01)

(58) Field of Classification Search
CPC ............................. H01J 37/20; H01J 37/3177
See application file for complete search history.

(56) References Cited

U.S. PATENT DOCUMENTS

2011/0272576 A1 11/2011 Otaki et al.
2013/0187046 A1 7/2013 Zeidler et al.
2013/0299697 A1* 11/2013 Enyama .................. H01J 37/28
250/306

(Continued)

FOREIGN PATENT DOCUMENTS

| EP | 2317535 | A2 | 5/2011 |
| EP | 2317535 | A3 | 7/2014 |
| EP | 3457426 | A1 | 3/2019 |

(Continued)

OTHER PUBLICATIONS

International Search Report issued in related Foreign Application No. PCT/EP2021/072713; mailed Dec. 8, 2021 (3 pgs.).

*Primary Examiner* — Tony Ko
(74) *Attorney, Agent, or Firm* — FINNEGAN, HENDERSON, FARABOW, GARRETT & DUNNER LLP

(57) ABSTRACT

Disclosed herein is a multi-beam charged particle column configured to project a multi-beam of charged particles towards a target, the multi-beam charged particle column comprising at least one aperture array comprising at least two different aperture patterns; and a rotator configured to rotate the aperture array between the different aperture patterns.

20 Claims, 11 Drawing Sheets

(56)     References Cited

U.S. PATENT DOCUMENTS

2019/0393013 A1    12/2019  Sed'A et al.
2020/0203116 A1     6/2020  Winkler et al.

FOREIGN PATENT DOCUMENTS

EP            3588531  A1     1/2020
EP            3671803  A1     6/2020
JP         2019207804  A     12/2019
TW          201804506  A      2/2018
TW          201917767  A      5/2019
WO     WO 2019/166331  A2     9/2019

* cited by examiner

Fig. 1

MULTI-BEAM CHARGED PARTICLE COLUMN

CROSS-REFERENCE TO RELATED APPLICATIONS

This application claims priority of International application PCT/EP2021/072713, which was filed on 16 Aug. 2021, and which claims priority of U.S. application 63/074,334, which was filed on 3 Sep. 2020, and of EP Application Serial No. 20200741.5, which was filed on 8 Oct. 2020. These applications are each incorporated herein by reference in their entireties.

FIELD

The embodiments provided herein generally relate the provision of a multi-beam charged particle column, for example for use in a charged particle beam inspection apparatus. Embodiments also provide an aperture array and a method of projecting a multi-beam of charged particles to a target.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an import process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a target at a relatively low landing energy. The beam of electrons is focused as a probing spot on the target. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the target. By scanning the primary electron beam as the probing spot over the target surface, secondary electrons can be emitted across the surface of the target. By collecting these emitted secondary electrons from the target surface, a pattern inspection tool may obtain an image representing characteristics of the material structure of the surface of the target.

Another application for a charged particle column (also known as an electron-optical column) is lithography. The charged particle beam reacts with a resist layer on the surface of a substrate. A desired pattern in the resist can be created by controlling the locations on the resist layer that the charged particle beam is directed towards.

A charged particle column may be an apparatus for generating, illuminating, projecting and/or detecting one or more beams of charged particles. The charged particle column is configured to project a multi-beam of charged particles to the target. Settings of the charged particle column may be adjusted depending on the type and number of features of the target to be inspected. When the settings of the charged particle column are adjusted, the level of performance of the charged particle column can vary. It is possible for the level of performance to be undesirably lower for some settings of the charged particle column.

There is a general need to improve the charged particle column having an improved performance over a range of different settings of the charged particle column. For example, it is desirable to provide improved resolution at the target for a range of different beam currents.

SUMMARY

According to some embodiments of the present disclosure, there is provided a multi-beam charged particle column configured to project a multi-beam of charged particles towards a target, the multi-beam charged particle column comprising: at least one aperture array comprising at least two different aperture patterns; and a rotator configured to rotate the aperture array so as to switch between the different aperture patterns.

According to some embodiments of the present disclosure, there is provided a multi-beam charged particle column configured to project a multi-beam of charged particles towards a target, the multi-beam charged particle column comprising: a beam former array comprising at least two different aperture patterns, the beam former array being the first element in the path of a primary beam emitted by a charged particle source, the aperture patterns defined in the beam former array configured to reduce the current in the path down-beam of the beam former array; and a beam-limiting aperture array down-beam of the beam former array; wherein the different aperture patterns of the beam former array are configured to be selectable.

According to some embodiments of the present disclosure, there is provided a multi-beam charged particle column configured to project a multi-beam of charged particles towards a target, the multi-beam charged particle column comprising: a beam-limiting aperture array configured to shape beamlets of the multi-beam projected towards the target, the beam-limiting aperture array comprising at least two different aperture patterns, wherein one of the aperture patterns comprises a flooding aperture pattern; a manipulator array aligned with the beam-limiting aperture array and comprising at least one manipulator pattern configured to operate on the beamlets projected towards the target; and a mover configured to move the beam-limiting aperture array together with the manipulator array so as to switch between the different aperture patterns.

According to some embodiments of the present disclosure, there is provided a multi-beam charged particle column configured to project a multi-beam of charged particles towards a target, the multi-beam charged particle column comprising: a beam-limiting aperture array comprising at least two different aperture patterns configured to shape beamlets of the multi-beam projected towards the target, wherein the different aperture patterns are interleaved; and a mover configured to move the beam-limiting aperture array so as to switch between the different aperture patterns.

According to some embodiments of the present disclosure, there is provided a multi-beam charged particle column configured to project a multi-beam of charged particles towards a target, the multi-beam charged particle column comprising: a beam-limiting aperture array comprising at least three different aperture patterns configured to shape beamlets of the multi-beam projected towards the target; a manipulator array comprising a manipulator pattern configured to align with the aperture pattern in the path of charged particles and operate on the beamlets projected to the target; and a mover configured to move the beam-limiting aperture array in one degree of freedom relative to the manipulator array so as to switch between the different aperture patterns.

According to some embodiments of the present disclosure, there is provided an aperture array for a multi-beam charged particle column configured to project a multi-beam of charged particles towards a target, the aperture array comprising a plurality of different aperture patterns, wherein: the aperture array is shiftable relative a manipulator array comprising a manipulator array configured to align with the aperture pattern in the path of charged particles; the different aperture patterns have the same pitch; and the different aperture patterns are interleaved.

According to some embodiments of the present disclosure, there is provided a method of projecting a multi-beam of charged particles to a target, the method comprising: rotating at least one aperture array comprising at least two different aperture patterns so as to switch between the different aperture patterns.

According to some embodiments of the present disclosure, there is provided a method of projecting a multi-beam of charged particles to a target, the method comprising: emitting a primary beam of charged particles from a charged particle source; using a beam former array comprising at least two different aperture patterns, the beam former array being the first element in the path of the primary beam, the aperture patterns defined in the beam former array configured to reduce the current in the path down-beam of the beam former array; shaping beamlets of the multi-beam projected to the target using a beam-limiting aperture array down-beam of the beam former array; and switching between the different aperture patterns of the beam former array.

According to some embodiments of the present disclosure, there is provided a method of projecting a multi-beam of charged particles to a target, the method comprising: using a beam-limiting aperture array comprising at least one aperture pattern to shape beamlets of the multi-beam projected to the target; using a manipulator array comprising at least one manipulator pattern aligned with the aperture pattern in the path of charged particles so as to operate on the beamlets projected to the target; and moving the beam-limiting aperture array together with the manipulator array so as to switch between said aperture pattern and another aperture pattern of the beam-limiting aperture array comprising a flooding aperture pattern.

According to some embodiments of the present disclosure, there is provided a method of projecting a multi-beam of charged particles to a target, the method comprising: using a beam-limiting aperture array comprising at least two different aperture patterns to shape beamlets of the multi-beam projected to the target, wherein the different aperture patterns are interleaved; and moving the beam-limiting aperture array so as to switch between the different aperture patterns.

According to some embodiments of the present disclosure, there is provided a method of projecting a multi-beam of charged particles to a target, the method comprising: using a beam-limiting aperture array comprising at least three different aperture patterns to shape beamlets of the multi-beam projected to the target; using a manipulator array comprising a manipulator array aligned with the aperture pattern in the path of charged particles to operate on the beamlets projected to the target; and moving the beam-limiting aperture array in one degree of freedom relative to the manipulator array so as to switch between the different aperture patterns.

Advantages of the various embodiments will become apparent from the following description taken in conjunction with the accompanying drawings wherein are set forth, by way of illustration and example, certain examples of the present disclosure.

BRIEF DESCRIPTION OF FIGURES

The above and other aspects of the present disclosure will become more apparent from the description of exemplary embodiments, taken in conjunction with the accompanying drawings.

FIG. 1 is a schematic diagram illustrating an exemplary charged particle beam inspection apparatus.

Figure 2:
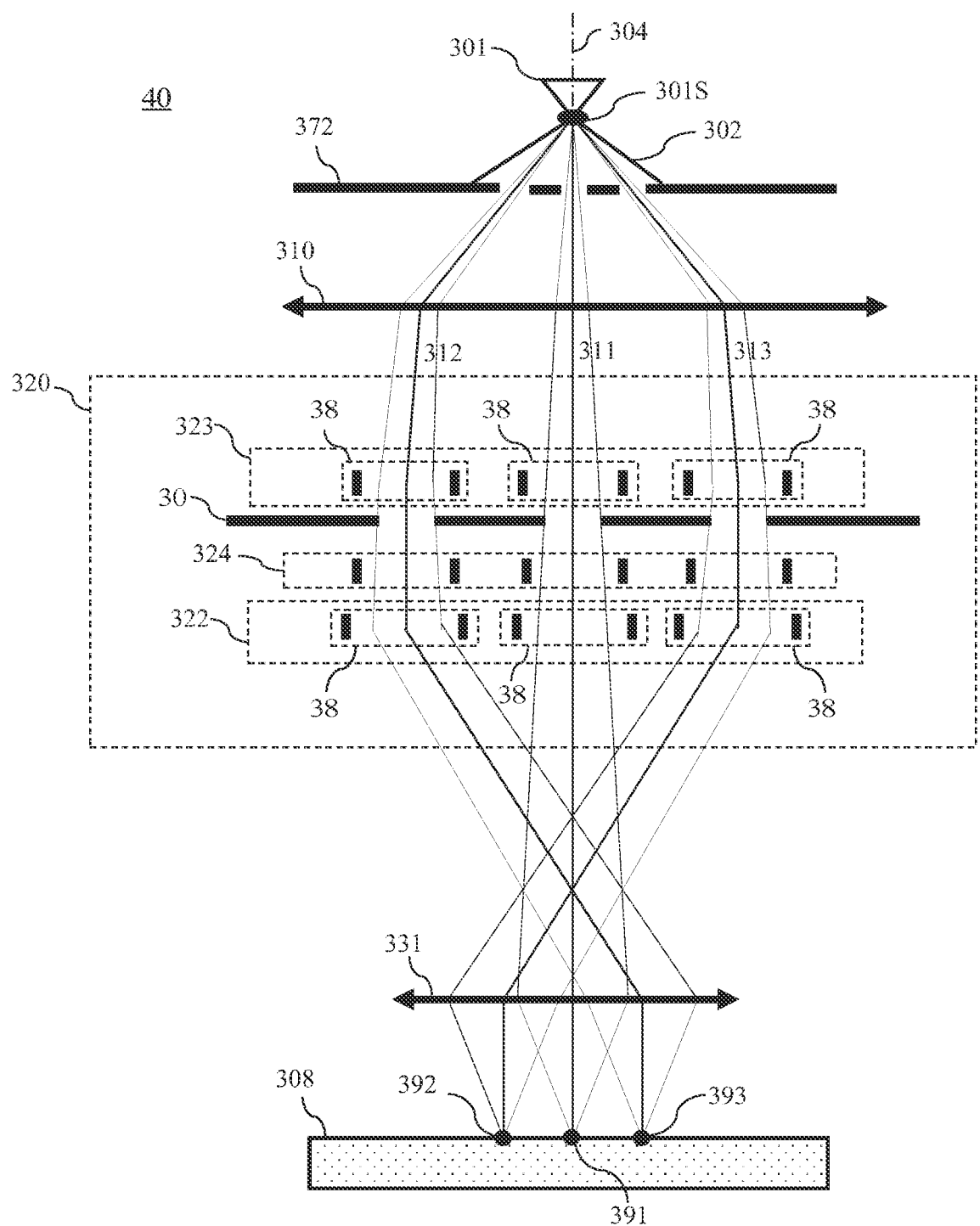
FIG. 2 is a schematic diagram illustrating an exemplary multi-beam charged particle column that is part of the exemplary inspection apparatus of FIG. 1.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the invention as recited in the appended claims.

DETAILED DESCRIPTION

An error in any step of the process of manufacturing an IC chip has the potential to adversely affect the functioning of the final product. It is desirable to improve the overall yield of the process. For example, to obtain a 75% yield for a 50-step process (where a step may indicate the number of layers formed on a wafer), each individual step must have a yield greater than 99.4%. If an individual step has a yield of 95%, the overall process yield would be as low as 7-8%.

Maintaining a high substrate (i.e. wafer) throughput, defined as the number of substrates processed per hour, is also desirable. High process yield and high substrate throughput may be impacted by the presence of a defect. This is especially if operator intervention is required for reviewing the defects. High throughput detection and identification of micro and nano-scale defects by inspection tools (such as a Scanning Electron Microscope ('SEM')) is desirable for maintaining high yield and low cost for IC chips.

A SEM comprises a scanning device and a detector apparatus. The scanning device comprises an illumination apparatus that comprises an electron source, for generating primary electrons, and a projection apparatus for scanning a target, such as a substrate, with one or more focused beams of primary electrons. The primary electrons interact with the target and generate interaction products, such as secondary electrons and/or backscattered electrons. The detection apparatus captures the secondary electrons and/or backscattered electrons from the target as the target is scanned so that the SEM may create an image of the scanned area of the target. For high throughput inspection, some of the inspection apparatuses use multiple focused beams, i.e. a multibeam, of primary electrons. The component beams of the multi-beam may be referred to as sub-beams or beamlets. A multi-beam may scan different parts of a target simultaneously. A multi-beam inspection apparatus may therefore inspect a target at a much higher speed than a single-beam inspection apparatus.

In a multi-beam inspection apparatus, the paths of some of the primary electron beams are displaced away from the central axis, i.e. a mid-point of the primary electron-optical axis (also referred to herein as the charged particle axis), of the scanning device. An implementation of a known multi-beam inspection apparatus is described below.

The Figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons, and items referred with reference to electrons, throughout the present document may therefore be more generally be considered to be references to charged particles, and items referred to in reference to charged particles, with the charged particles not necessarily being electrons.

Figure 1:
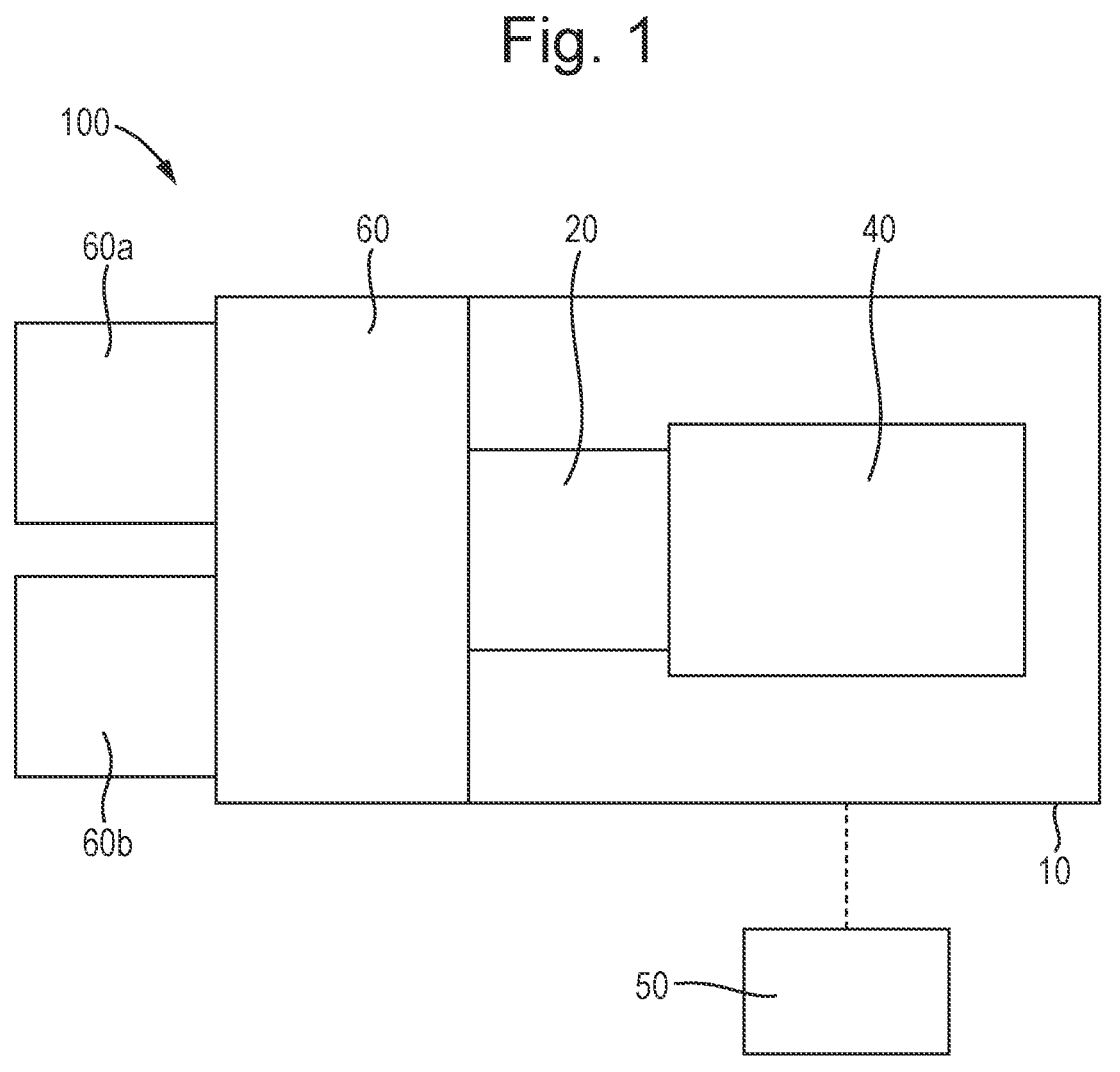

Reference is now made to FIG. 1, which is a schematic diagram illustrating an exemplary charged particle beam inspection apparatus 100. The inspection apparatus 100 of FIG. 1 includes a vacuum chamber 10, a load lock chamber 20, a charged particle column 40 (also known as an electron-optical column or an electron beam tool), an equipment front end module (EFEM) 60 and a controller 50.

The EFEM 60 includes a first loading port 60a and a second loading port 60b. The EFEM 60 may include additional loading port(s). The first loading port 60a and second loading port 60b may, for example, receive substrate front opening unified pods (FOUPs) that contain substrates (e.g., semiconductor substrates or substrates made of other material(s)) or targets to be inspected (substrates, wafers and samples are collectively referred to as "targets" hereafter). One or more robot arms (not shown) in EFEM 60 transport the targets to load lock chamber 20.

The load lock chamber 20 is used to remove the gas around a target. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. The main chamber 10 is connected to a main chamber vacuum pump system (not shown). The main chamber vacuum pump system removes gas molecules in the main chamber 10 so that the pressure around the target reaches a second pressure lower than the first pressure. After reaching the second pressure, the target is transported to the charged particle column 40 by which it may be inspected. A charged particle column 40 may comprise either a single beam or a multi-beam electron-optical apparatus.

The controller 50 is electronically connected to the charged particle column 40. While the controller 50 is shown in FIG. 1 as being outside of the structure that includes the main chamber 10, the load lock chamber 20, and the EFEM 60, it is appreciated that the controller 50 may be part of the structure.

Reference is now made to FIG. 2, which is a schematic diagram of an exemplary multi-beam charged particle column 40 of the inspection apparatus 100 of FIG. 1. The charged particle column 40 may comprise an electron source 301, a beam former array 372 (also known as a coulomb aperture array or a pre-sub-beam-forming aperture array), a condenser lens 310, a source converter (or micro-optical array) 320, an objective lens 331, and a target 308.

In some embodiments, the condenser lens 310 is magnetic. In some embodiments, the condenser lens 310 is a condenser lens arrangement comprising two or more components which may have different excitation states which can be obtained by varying their relative distance and the current passing through them. The components may be controlled so that the net rotation is stable through a range of excitation states, i.e. the condenser lens arrangement may have one or more anti-rotation settings.

The target 308 may be supported by a support on a stage. The stage may be motorized. The stage may be moved so that the sample 308 is scanned by the incidental electrons. The electron source 301, the beam former array 372, the condenser lens 310 may be the components of an illumination apparatus comprised by the charged particle column 40. The source converter 320 and the objective lens 331 may be the components of a projection apparatus comprised by the charged particle column 40.

The electron source 301, the beam former array 372, the condenser lens 310, the source converter 320, and the objective lens 331 are aligned with a primary electron-optical axis 304 of the charged particle column 40. The electron source 301 generates a primary beam 302 generally along the electron-optical axis 304 and with a source cross-over (virtual or real) 301S. During operation, the electron source 301 is configured to emit electrons. The electrons are extracted or accelerated by an extractor and/or an anode to form the primary beam 302.

The beam former array 372 cuts the peripheral electrons of primary electron beam 302 to reduce a consequential Coulomb effect. The primary-electron beam 302 may be trimmed into a specified number of sub-beams, such as three sub-beams 311, 312 and 313, by the beam former array 372. It should be understood that the description is intended to apply to a charged particle column 40 with any number of sub-beams such as one, two or more than three. The beam former array 372, in operation, is configured to block off peripheral electrons to reduce the Coulomb effect. The Coulomb effect may enlarge the size of each of the probe spots 391, 392, 393 and therefore deteriorate inspection resolution. The beam former array 372 reduces aberrations resulting from Coulomb interactions between electrons projected in the beam. The beam former array 372 may include multiple openings for generating primary sub-beams even before the source converter 320.

The source converter 320 is configured to convert the beam (including sub-beams if present) transmitted by the beam former array 372 into the sub-beams that are projected down-beam of the source converter 320 towards the target 308. In some embodiments, the source converter is a unit. Alternatively, the term source converter may be used simply as a collective term for the group of components that operate on the sub-beams.

As shown in FIG. 2, in an example, the charged particle column 40 comprises a beam-limiting aperture array 30 with an aperture pattern (i.e. apertures arranged in a formation) configured to define the outer dimensions of the beamlets (or sub-beams) projected towards the target 308. In some embodiments, the beam-limiting aperture array 30 divides one or more of the sub-beams 311, 312, 313 into beamlets such that the number of beamlets projected towards the target 308 is greater than the number of sub-beams transmitted through the beam former array 372. In an alternative example, the beam-limiting aperture array 30 does not divide the sub-beams in which case the number of sub-beams may equal the number of beamlets projected towards the target 308.

As shown in FIG. 2, in an example, the charged particle column 40 comprises a pre-bending deflector array 323 with pre-bending deflectors 323_1, 323_2, and 323_3 to bend the sub-beams 311, 312, and 313 respectively. The pre-bending deflectors 323_1, 323_2, and 323_3 may bend the path of the sub-beams 311, 312, and 313 onto the beam-limiting aperture array 30. In an alternative example, the pre-bending deflector array 323 is not provided.

The charged particle column 40 may also include an image-forming element array 322 with image-forming deflectors 38. There is a respective deflector 38 associated with the path of each beamlet. The deflectors 38 are configured to deflect the paths of the beamlets towards the electron-optical axis 304. The deflected beamlets form virtual images (not shown) of source crossover 301S. In the current example, these virtual images are projected onto the target 308 by the objective lens 331 and form probe spots 391, 392, 393 thereon. The charged particle column 40 may also include an aberration compensator array 324 configured to compensate aberrations that may be present in each of the sub-beams. In some embodiments, the aberration compensator array 324 comprises a lens 37 configured to operate on a respective beamlet. The lens 37 may take the form of an array of lenses. In some embodiments, the aberration compensator array 324 comprises a field curvature compensator array (not shown) with micro-lenses. The field curvature compensator and micro-lenses may, for example, be configured to compensate the individual sub-beams for field curvature aberrations evident in the probe spots, 391, 392, and 393. The aberration compensator array 324 may include an astigmatism compensator array (not shown) with micro-stigmators. The micro-stigmators may, for example, be controlled to operate on the sub-beams to compensate astigmatism aberrations that are otherwise present in the probe spots, 391, 392, and 393.

In the current example of the charged particle column 40, the beamlets are respectively deflected by the deflectors 38 of the image-forming element array 322 towards the electron-optical axis 304. It should be understood that the beamlet path may already correspond to the electron-optical axis 304 prior to reaching deflector 38, accordingly the beamlet path may continue straight past the deflector 38.

The objective lens 331 focuses the beamlets onto the surface of the target 308, i.e., it projects the three virtual images onto the target surface. The three images formed by three sub-beams 311 to 313 on the target surface form three probe spots 391, 392 and 393 thereon. In some embodiments, the deflection angles of sub-beams 311 to 313 are adjusted to pass through or approach the front focal point of objective lens 331 to reduce or limit the off-axis aberrations of three probe spots 391 to 393. In an arrangement the objective lens is magnetic. Note though three beamlets are mentioned, this is by way of example only. There may be any number of beamlets.

The pre-bending deflector array 323, the aberration compensator array 324 and the image-forming element array 322 may individually or in combination with each other, be referred to as a manipulator array 34, because they manipulate one or more sub-beams or beamlets of charged particles. The lens 37 and the deflectors 38 may be referred to as manipulators because they manipulate one or more sub-beams or beamlets of charged particles.

In some embodiments, a secondary column (not shown) is provided comprising a detector. The detector may be configured to detect electrons, e.g. secondary electrons, from the target 308. In some embodiments, the detector comprises detection elements that may detect corresponding secondary electron beams. On incidence of secondary electron beams with the detection elements, the elements may generate corresponding intensity signal outputs. The outputs may be directed to an image processing system (e.g., controller 50). Each detection element may comprise one or more pixels. The intensity signal output of a detection element may be a sum of signals generated by all the pixels within the detection element. The embodiments of the present disclosure are applicable to the secondary column. For example, the secondary column may be configured to function in different modes corresponding to different apertures in the path of the beam.

In some embodiments, a flood column (not shown) is provided. The flood column is configured to flood the target with charged particles. The embodiments of the present disclosure are applicable to the flood column. For example, the flood column may be configured to function in different modes corresponding to different apertures in the path of the beam.

The one or more electron-optical components in the column, especially those that operate on beams or sub-beams or generate beams or sub-beams, such as pre-bending deflectors, aperture arrays and manipulator arrays may comprise one or more microelectromechanical systems (MEMS). MEMS are miniaturized mechanical and electromechanical elements that are made using microfabrication techniques. In some embodiments, the charged particle column 40 comprises apertures, lenses and deflectors formed as MEMS. In some embodiments, the manipulators such as the lenses 37 and deflectors 38 are controllable, passively, actively, as a whole array, individually or in groups within an array, so as to control the beamlets of charged particles projected towards the target 308.

Although not shown in FIG. 2, the charged particle column 40 may comprise alternative and/or additional components on the charged particle path, such as lenses and other components as described earlier. In particular, embodiments also include a charged particle column 40 that divides a charged particle beam from a source 301 into a plurality of sub-beams. A plurality of respective objective lenses may project the sub-beams onto the target 308. In some embodiments, a plurality of condenser lenses is provided up-beam from the objective lenses. The condenser lenses focus each of the sub-beams to an intermediate focus up-beam of the objective lenses. In some embodiments, collimators are provided up-beam from the objective lenses. Correctors may be provided to reduce focus error and/or aberrations. In some embodiments, such correctors are integrated into or positioned directly adjacent to the objective lenses. Where condenser lenses are provided, such correctors may additionally, or alternatively, be integrated into, or positioned directly adjacent to, the condenser lenses and/or positioned in, or directly adjacent to, the intermediate foci. A detector may be provided to detect charged particles emitted by the target 308. The detector may be integrated into the objective lens. The detector may be on the bottom surface of the objective lens so as to face a sample in use. The condenser lenses, objective lenses and/or detector may be formed as MEMS or CMOS devices. The embodiments of the present disclosure are applicable to an example having such additional components.

Figure 3:
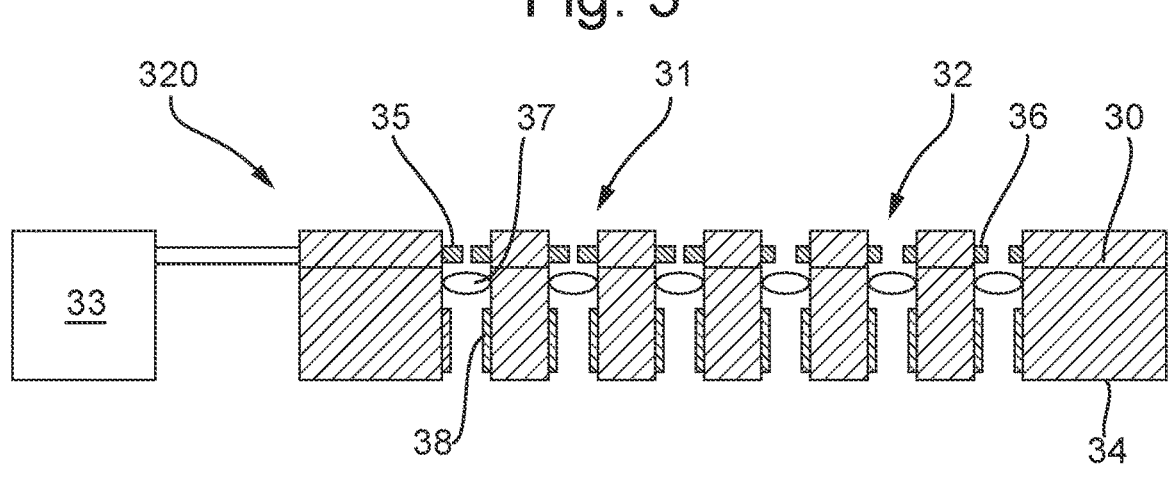
FIG. 3 is a schematic diagram of part of a charged particle column according to some embodiments of the present disclosure.

FIG. 3 schematically depicts part of a charged particle column 40 according to some embodiments. FIG. 3 shows parts of the charged particle column 40 that convert the sub-beam(s) to the beamlets that are projected towards the target 308. These parts may be collectively known as a source converter 320, or a micro-optical array. The multi-beam charged particle column 40 is configured to project (e.g., operate on) a multi-beam of charged particles towards the target 308.

As shown in FIG. 3, in an example, the charged particle column 40 comprises a beam-limiting aperture array 30. In some embodiments, the beam-limiting aperture array 30 comprises at least two different aperture patterns 31, 32. The aperture patterns 31, 32 are configured to shape beamlets of the multi-beam projected towards the target 308. In some embodiments, the different aperture patterns 31, 32 correspond to different sizes of aperture. For example, one of the aperture patterns 31 has smaller apertures 35. Another one of the aperture patters 32 has larger apertures 36. Additionally or alternatively, the different aperture patters 31, 32 may correspond to different numbers or apertures. For example, one of the aperture patterns may have a smaller number of apertures than another of the aperture patterns. Additionally or alternatively, the different aperture patterns may correspond to different formations of apertures. For example, the pitch between the apertures may be different for the different aperture patterns. Alternatively the pitch of the apertures in each pattern may be the same or similar.

The beamlets of the multi-beam that reach the target 308 are beamlets that have been shaped by one of the aperture patterns 31, 32. The other aperture patterns are either not in the path of charged particles (such that they do not shape the beamlets) or the beamlets that the apertures shape are blocked from reaching the target 308.

In some embodiments, the multi-beam charged particle column 40 is configured to switch between different modes corresponding between different aperture patterns 31, 32. Different modes may be selected by selecting an aperture pattern 31, 32 in the beam-limiting aperture array 30.

By having different modes corresponding to the different aperture patterns 31, 32, it is possible to control and indeed optimise the properties of the beamlets projected towards the target 308. For example, the different aperture patterns 31, 32 can be switched so as to improve the resolution at the target 308 for a range of different currents, indeed for a specific operating current in order to obtain a desired resolution.

The type of aperture pattern in use affects the properties of the beamlets that are projected towards the target 308. For example, the type of aperture pattern used can control the number of beamlets, the size of the beamlets and/or the formation of the beamlets on the target 308. Selection of a different pattern can alter the beam current reaching the target 308. Different diameters of aperture can affect therefore the resolution that can be achieved at the target 308. It is desirable to use the aperture pattern that has the diameter of aperture that allows a better resolution at the target 308 be achieved for the given current.

The selected beam current affects the resolution and the signal-to-noise performance of the inspection of the target 308. A larger current may reduce the resolution but will allow inspection of a larger target 308 within a given time period. The beam current may be selected based on the size of target 308 to be inspected within the given time period. The type of aperture pattern may be selected based on the beam current. In some embodiments, the type of aperture pattern, and in particular, the diameter of aperture, that provides better resolution may depend on other factors. For example, the current of the multi-beam can be varied during use of the charged particle column 40. Different currents may be used in order to inspect different features on the target 308. For different currents, the different aperture pattern (e.g., a different diameter of aperture) may allow better resolution at the target 308.

In some embodiments the beam-limiting aperture array 30 is shiftable. As depicted in FIG. 3, in an example, the multi-beam charged particle column 40 comprises a mover 33, such as an actuator. In some embodiments, the mover 33 is configured to move the beam-limiting aperture array 30 so as to switch between the different modes of the charged particle column 40 corresponding to the different aperture patterns 31, 32. By moving the beam-limiting aperture array 30, a selected one of the aperture patterns 31, 32, can be positioned in the path of charged particles. For example, when it is desired for smaller apertures 35 to be used, the mover 33 controls the position of the beam-limiting aperture array 30 such that the aperture pattern 31 having the smaller apertures 35 in the path of charged particles. When it is desired for larger apertures 36 to be used, the mover 33 can move the beam-limiting aperture array such that the aperture pattern 32 having the larger aperture 36 is in the path of the charged particles. Such examples are expected to improve, and even enable control of the achievable resolution at the target 308 over a range of different currents.

There are different ways in which the mover 33 may be configured to move the beam-limiting aperture array 30. In some embodiments, the mover 33 comprises a rotator. The rotator is configured to rotate the beam-limiting aperture array 30 so as to switch between the different modes. The rotator may rotate the beam-limiting aperture array 30, and the associated electron-optical elements, around an axis orthogonal to the plane of the beam-limiting aperture array 30. The axis of rotation may be about or towards the middle of the beam-limiting aperture array 30. Having the axis or rotation about or towards the middle of the beam-limiting aperture array 30 enables a number of patterns may be located in a successive loop around the axis; so four patterns may be located in four quadrants at positions of 90 degrees from each other. In another arrangement, the point of rotation or axis of rotation may be remote from the patterns for example at or towards the middle of the beam-limiting aperture array 30. The point of rotation may be remote from the patterns such that angular rotation between the patterns is small. The point of rotation may be remote from the patterns so that the path of rotation is an arc. The path of rotation may be an arc with a relatively large angle of curvature, that is for example substantially straight. The patterns may be located on the same arcuate path, for example with respect to the point of rotation. The axis of rotation may be displaced away from the middle, for example the center, of the beam limiting aperture array 30. The axis of rotation may be towards the edge or even at the edge of the beam limiting aperture array 30. The beam limiting aperture array may have a planar shape with a corner. The axis of rotation may be towards or even at the corner of the beam limiting aperture array. The axis of rotation may be displaced further from the patterns than the distance between patterns, for example adjoining patterns in the beam limiting aperture array 30. The axis of rotation may be remote from the beam limiting aperture array. The rotator may be connected to the beam limiting aperture array 30 remote from the axis of rotation. The rotator may be configured to rotate the beam limiting aperture array 30 and the associated electron optical elements around an axis of rotation away or distant from the beam limiting aperture array 30. The different modes correspond to different aperture patterns 31, 32 being in the path of charged particles from the source 301 of the charged particle column 40.

In some embodiments, the mover 33 is configured to translationally move the beam-limiting aperture array 30 so as to switch between the different modes. In some embodiments, the mover 33 is configured to move the beam-limiting aperture array 30 in a plane perpendicular to the electron-optical axis 304. The patterns may be placed along a line of two or more patterns. The beam-limiting aperture array 30 may take the form of a strip, In some embodiments, the rotational movement may be combined with the translational movement. The mover 33 may be configured to move the beam-limiting array 30 rotationally and translationally so as to control which aperture pattern 31, 32 is in the path of charged particles.

As shown in FIG. 3, in an example, the charged particle column 40 comprises a manipulator array 34. The manipulator array 34 comprises at least one manipulator pattern. A manipulator pattern is an arrangement of manipulators. In some embodiments, the manipulators comprise lenses 37 and/or deflectors 38, i.e. a micro-optical column. The manipulators are configured to operate on the beamlets of the multi-beam projected along a path towards the target 308. In some embodiments, the manipulator patterns are defined in a MEMS device, such as the beam-limiting aperture array 30. In some embodiments, the manipulator array 34 comprises the aberration compensator array 324 and/or the image-forming element array 322 described above. In an arrangement elements of the micro-optical columns may be MEMS devices.

As shown in FIG. 3, in an example, the manipulator array 34 comprises a manipulator pattern aligned with each of the aperture patterns 31, 32 of the beam-limiting aperture array 30. In an alternative example, one or more of the aperture patterns 31, 32 may not have a corresponding manipulator pattern. For example, there may not be any lens 37 or deflectors 38 positioned immediately down-beam of the apertures of one or more of the aperture patterns, and particularly a flooding aperture pattern, of the beam-limiting aperture array 30.

In some embodiments, the mover 33 is configured to move the beam-limiting array 30 together with the manipulator array 34 so as to switch between the different modes. For example, as shown in FIG. 3, in an example, the beam-limiting aperture array 30 is formed integrally with the manipulator array 34. In some embodiments, the beam-limiting aperture array 30 comprises a plate in which apertures 35, 36 of different of different aperture patterns 31, 32 are defined. In some embodiments, the manipulator array 34 comprises a plate in which manipulators such as lens have 37 and/or deflectors 38 are embedded, such as integrally formed. A shown in FIG. 3, in an example, the plates of the beam-limiting aperture array 30 and the manipulator array 34 are formed as a single planar structure. Within the single planar structure, micro-columns are formed. Each micro-column may comprise an aperture 35, 36 up-beam of a lens 37 and a set of deflectors 38 (at least two, though there can be more typically in multiples of two). The aperture 35, 36 shapes the beamlet which is then operated on by the lens 37 and the deflectors 38; that is not only does the micro-column of electron-optical elements operate on the beamlet, but the cross-section of the beamlet is altered by the aperture 35,36. In an arrangement, up-beam of the beam-limiting aperture array 30, the beamlets have yet to be generated from the source beam. In such an arrangement the source beam of charged particles is shaped to generate a beamlet for each aperture 35, 36. The beamlet is projected towards the target 308.

By moving the beam-limiting aperture array 30 together with the manipulator array 34, alignment between the beam-limiting array 30 and the manipulator array 34 is made more reliable. Such examples are expected to achieve an improvement in resolution across a range of currents without adversely affecting alignment of beamlets projected towards the target 308. Any misalignment may adversely affect the quality of the beamlets projected towards the target 308.

Figure 4:
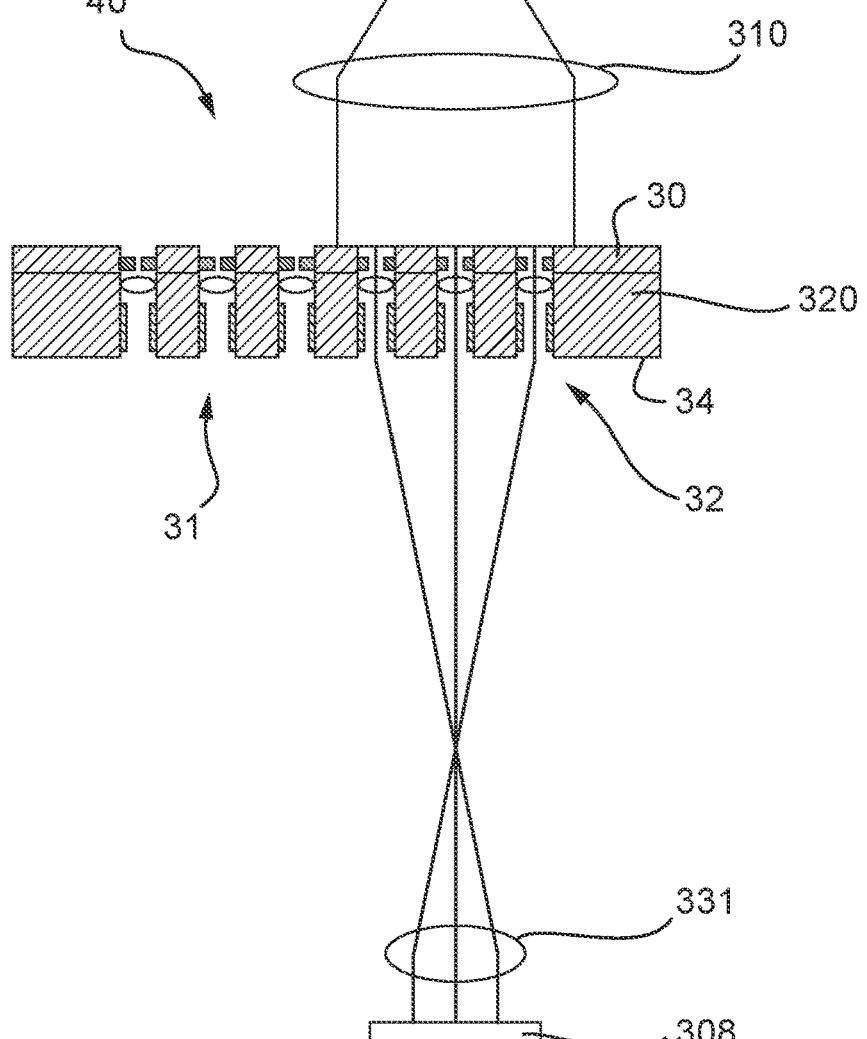
FIGS. 4 and 5 schematically depict different modes of a charged particle column according to some embodiments of the present disclosure.

FIG. 4 schematically depicts a charged particle column 40 comprising the source converter 320 shown in FIG. 3. As shown in FIG. 4, in an example, charged particles are emitted from a source 301. The beam path passes through a condenser lens 310 towards the source converter 320. As depicted, the beam-limiting aperture array 30 is positioned such that the aperture pattern 32 having wider apertures 36 is in the path of charged particles. The aperture pattern 32 shapes the beamlets which are then operated on by the lens 37 and the deflectors 38. The beamlets are projected towards the target 308 via an objective lens 331. Note in this arrangement the beamlets cross over at a focus point between the source converter 320 and the objective lens 331.

Figure 5:
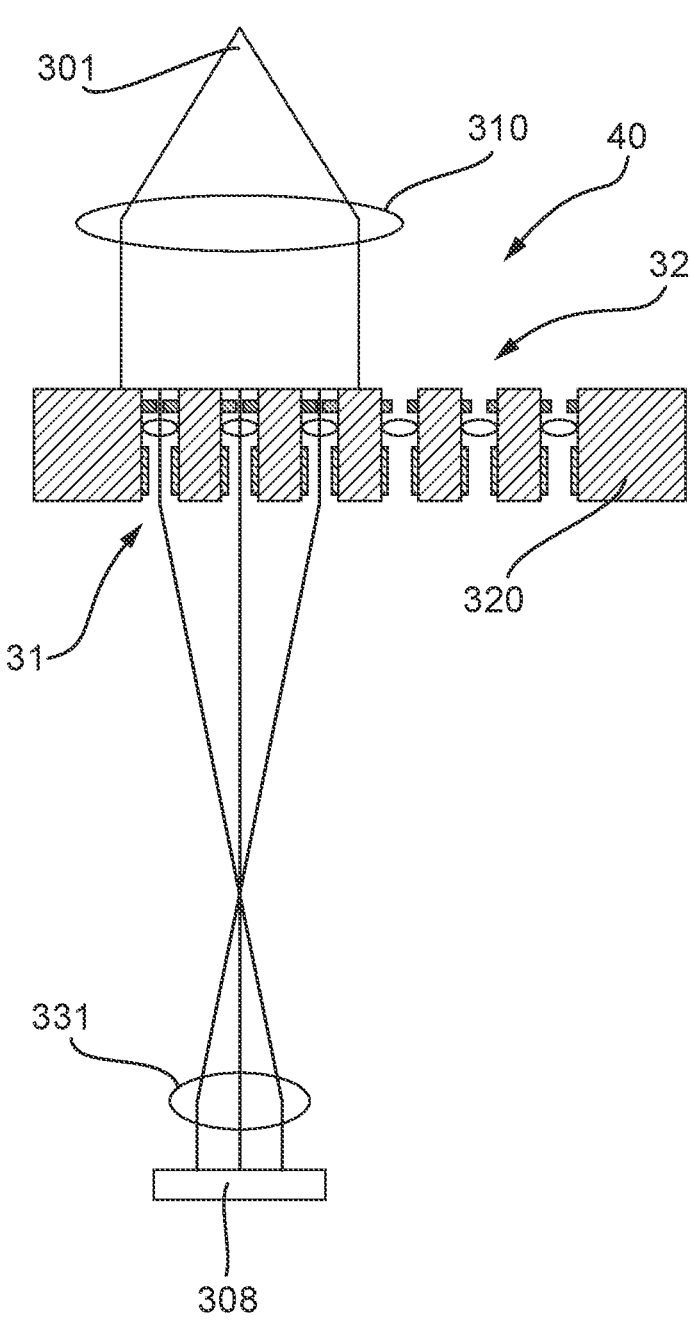

The source converter 320 can be moved such that another aperture pattern 31 having smaller apertures 35 may be selectively positioned in the path of charged particles. FIG. 5 schematically depicts the charged particle column 40 when the aperture pattern 31 having smaller apertures 35 is in the path of charged particles. The arrangements shown in FIGS. 4 and 5 correspond to different modes of operation/projection of the charged particle column 40; noting each mode may have a different current and/or resolution.

In some embodiments, a controller controls which aperture pattern 31, 32 is in the path of charged particles based on the current emitted by the source 301. Such embodiments are expected to improve resolution at the target 308. That is, by swapping micro-optics, a different beam current is provided which is optimised for a different range of resolution; thus different modes have different operation parameters.

Figure 6:
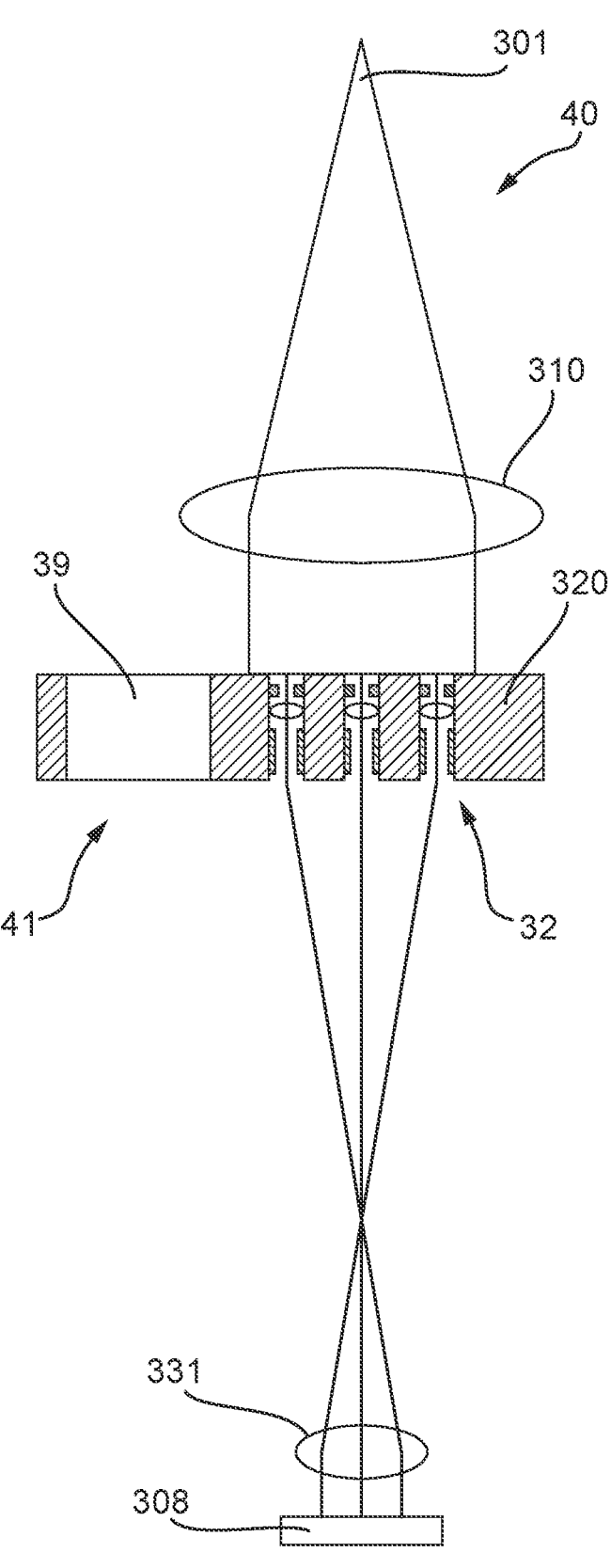
FIGS. 6 and 7 schematically depict different modes of operation of a charged particle column according to some embodiments of the present disclosure.

FIG. 6 schematically depicts part of a charged particle column 40 according to some embodiments of the present disclosure. As shown in FIG. 6, in an example, one of the aperture patterns comprises a flooding aperture pattern 41.

As shown in FIG. 6, in an example, the flooding aperture pattern 41 is a single opening 39. The flooding aperture pattern 41 is configured to allow a greater current to reach the target 308 than is allowed by any of the other aperture patterns 32. In some embodiments, the single opening 39 allows a greater current to reach the target 308 then is allowed by the total current through the apertures 36 of any of the other aperture patterns 32. In some embodiments, the cross-sectional area (in the plane perpendicular to the electron-optical axis 304) of the single opening 39 is greater than the sum of cross-sectional areas of the apertures 36 of the other, depicted aperture pattern 32.

By providing the flooding aperture pattern 41, the multi-beam can project through the flooding aperture pattern 41 towards the target 308. When the flooding aperture pattern 41 is in the path of charged particles, the target 308 can be charged so as to enable inspection of its features. After flooding the target, inspection may be achieved after swapping the flooding aperture pattern 41 from the beam path to a different aperture pattern 32. By having a large beam that floods the target 308 with charged particles, it is possible to simultaneously measure a larger number of connections. The target 308 is flooded by charge. Inspection of the charged flooded target 308 can reveal many features, components and connections simultaneously. Thus the inspection image generated will show a differently behaving feature. By providing a flooding aperture pattern 41, a flooding function is provided integrally in the main charged particle column. Such a charged particle column need not have a completely separate charged particle column, e.g. flood column, in order to be able to flood the target 308 with charged particles. However, some aspects of a flooding function can still be provided by a separate flood column. Having the flooding function in the main column means that inspection can occur much faster than flooding as only electron-optical elements need to be switched; whereas for a separate flood column, the whole wafer and wafer support such as the stage are moved between different stations.

As shown in FIG. 6, in an example, the manipulator array 34 does not comprise a manipulator pattern aligned with the flooding aperture pattern. There is no lens 37 or deflector 38 immediately down-beam of the single opening 39 of the flooding aperture pattern 41. When the flooding aperture pattern 41 is moved into the path of charged particles, the manipulator pattern is moved out from the path of charged particles. Alternatively, the manipulator array 34 may comprise manipulator elements for the flooding aperture pattern such as a lens and/or deflector.

Although not shown in FIG. 6, in an example, the flooding aperture pattern 41 comprises a plurality of openings 39. The openings are larger than the apertures 35, 36 of the other aperture patterns 32 of the beam-limiting aperture array 30. For example, the flooding aperture pattern 31 comprises two openings 39 or three openings 39. In such an arrangement, the beam current projected towards the target 308 may be sufficient to charge the target 308 to enable inspection of the charged target 308.

Figure 7:
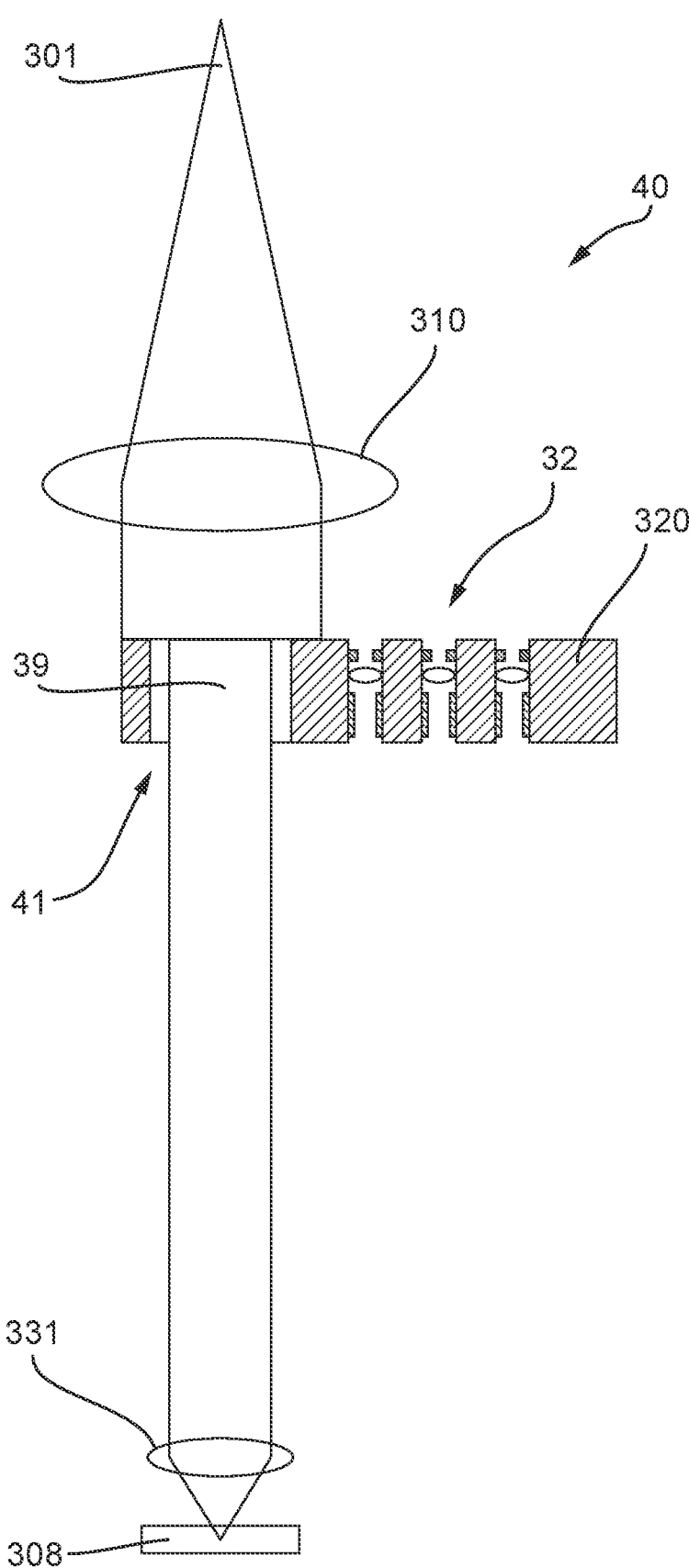

In some embodiments, the charged particle column 40 comprises a mover 33 (not depicted in FIG. 6 or 7) configured to move the beam-limiting aperture array 30 together with the manipulator array 34 so as to switch between the different modes of the charged particle column 40. For example, the mover 33 (not depicted) moves the beam-limiting aperture array 30, such that the flooding aperture pattern 41 is moved into the path of charged particles. The mover 33 may move the beam limiting aperture array 30 in any manner herein described, for example rotationally as described with respect to FIG. 3. In the depicted arrangement, the flooding aperture pattern 41 is in the path of charged particles. When the flooding aperture pattern 41 is in the path of charged particles, a wide beam is projected towards the target 308 via the objective lens 331. The projected beam or beams of charged particles towards the target 308 would be wider in cross-section than the patterns 31, 32 of the beam-limiting aperture array 32.

Figure 8:
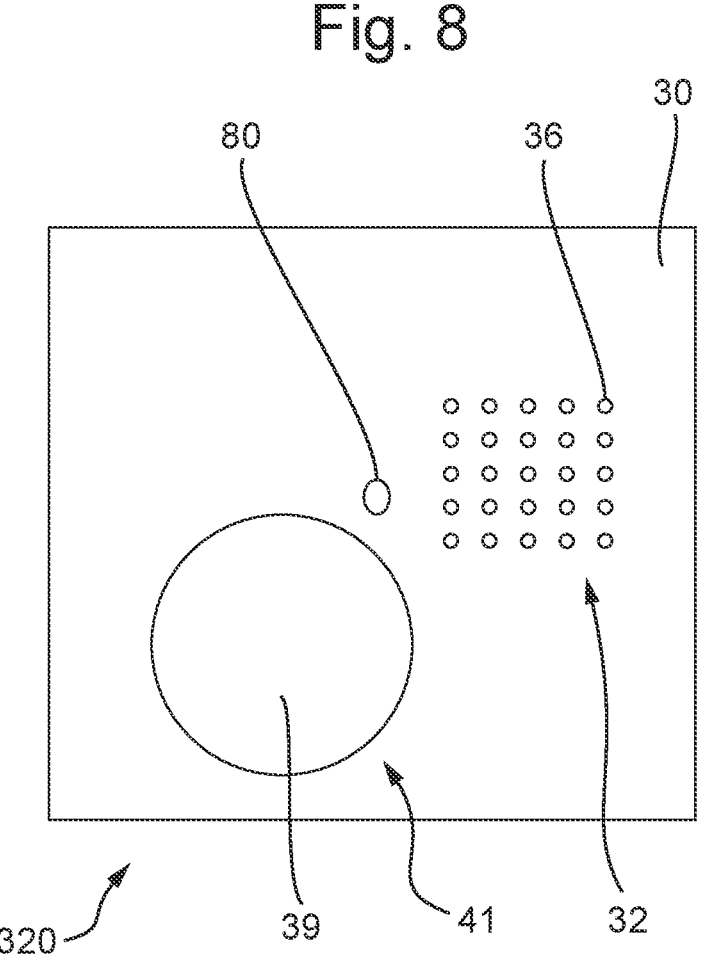
FIG. 8 schematically depicts a beam-limiting aperture array according to some embodiments of the present disclosure.

FIG. 8 is a schematic view of a beam-limiting aperture array 30 according to some embodiments of the present disclosure. FIG. 8 shows the beam-limiting aperture array 30 in a plan view, i.e., in the direction of the electron-optical axis 304. The beam-limiting aperture array 30 comprises a plurality of aperture patterns 41, 32. In the depicted arrangement, the flooding aperture pattern 41 is a single opening 39. The other aperture pattern 32 comprises 25 smaller apertures 36. The apertures 36 are arranged in a grid. Other possible formations of apertures 36 are possible, such as a hexagonal pattern. The pattern may be a regular rectilinear or hexagonal pattern, or it may be irregular such as skewed or rotated incorporating features from WO2014/177718 of which relevant elements on that topic are incorporated by reference.

As shown in FIG. 8, the different aperture patterns 41, 32 are defined in the same plate. In an alternative example the different aperture patterns 41, 32 are defined in different plates of the beam-limiting aperture array 30. As shown in FIG. 8, in an example, the beam-limiting aperture array 30 comprises a rotational axis 80. The rotational axis 80 is the rotational axis 80 around which the beam-limiting aperture array 30 is configured to rotate. For example, as explained above, the mover 33 comprises a rotator configured to rotate the beam-limiting aperture array 30 around the rotational axis 80. The rotational axis 80 may be about or towards the middle of the beam-limiting aperture array 30 so that a number of patterns may be located in a successive loop around the axis; so four patterns may be located in four quadrants at positions of 90 degrees from each other. In another arrangement, the rotational axis 80 may be remote from the patterns. The point of rotation may be remote from the patterns such that angular rotation between the patterns is small. The path of rotation is an arc. The arcuate path may have a relatively large angle of curvature that is for example substantially straight. The patterns may be located on the same arcuate path, for example with respect to the point of rotation. In some embodiments, the rotational axis 80 is parallel to the electron-optical axis 304 of the charged particle column 40. By rotating the beam-limiting aperture array 30 around the rotational axis 80, it is possible to control which of the different aperture patterns 41, 32 is in the path of charged particles. The rotator may be connected to the beam limiting aperture array 30 remote from the axis of rotation. Although shown in a central or mid-point of the beam-limiting aperture array 30, the rotational axis 80 may be located anywhere in the beam-limiting aperture array 30. The axis of rotation may be displaced away from the middle, for example the center, of the beam limiting aperture array 30. The axis of rotation may be towards the edge or even at the edge of the beam limiting aperture array 30. The beam limiting aperture array may have a planar shape with a corner. The axis of rotation may be towards or even at the corner of the beam limiting aperture array. The axis of rotation may be remote from the beam limiting aperture array. The different patterns are located in the beam-limiting aperture array 30 so that they may be selected by rotation about the rotational axis 80. The center of each pattern may be equidistantly positioned relative to the rotational axis 80. The axis of rotation may be displaced further from the patterns, such as relative the center of each pattern, than the distance between patterns, for example adjoining patterns (e.g., the centres of adjoining patterns) in the beam limiting aperture array 30. The beam-limiting aperture array 30 may be moved along an arc to select between patterns. The different aperture patterns 41, 32 may be disposed along an arc. The rotational displacement between consecutive or adjacent patterns is dependent on the relative displacement between the center of each pattern and the rotational axis 80. In the arrangement depicted in FIG. 8, the patterns are arranged around the rotational axis 80. The rotational displacement between patterns is large (e.g., 180 degrees).

As shown in FIG. 8, in an example, the beam-limiting aperture array 30 comprises two different types of aperture patterns 41, 32. In some embodiments, the beam-limiting aperture array 30 comprises three different aperture patterns, four different aperture patterns or more than four different aperture patterns.

As shown in FIG. 8, in an example, one of the aperture patterns is a flooding aperture pattern 41. In an alternative example, the beam-limiting aperture array 30 comprises two or three flooding aperture patterns. In an alternative example, the beam-limiting aperture array 30 comprises a plurality of aperture patterns 32 that are not flooding aperture patterns. In some embodiments, no flooding aperture pattern may be provided.

In FIG. 8, the rotational axis 80 is provided between the aperture patterns 41, 32, optionally at the center of the beam-limiting aperture array 30. In an alternative example the rotational axis 80 is provided to one side of the group of aperture patterns 41, 32. The rotational axis 80 may be further from the aperture patterns 41, 32 than is shown in FIG. 8. The rotator may be connected to the beam limiting aperture array 30 remote from the axis of rotation. The rotator may be configured to rotate the beam limiting aperture array 30 and the associated electron optical elements around an axis of rotation away or distant from the beam limiting aperture array 30. The axis of rotation may be displaced away from the middle, for example the center, of the beam limiting aperture array 30. The axis of rotation may be towards the edge or even at the edge of the beam limiting aperture array 30. The beam limiting aperture array may have a planar shape with a corner. The axis of rotation may be towards or even at the corner of the beam limiting aperture array. The axis of rotation may be remote from the beam limiting aperture array. The axis of rotation may be displaced further from the patterns, such as relative to the center of each pattern, than the distance between patterns, for example adjoining patterns (e.g., the centres of adjoining patterns) in the beam limiting aperture array 30. For example, the rotational displacement could be smaller (e.g. 90 degrees) by placing the two patterns side by side and the rotational axis in between two patterns, for example towards the edge of the beam-limiting aperture array 30. Such examples are expected to reduce the amount of rotation of the beam-limiting aperture array 30 required in order to switch between different aperture patterns 41, 32. In an arrangement, the distance between the rotational axis 80 and the center of a pattern is much larger than the distance between neighbouring patterns. In such an arrangement, the angular displacement would be small, e.g., 1 or 2 degrees; the arc length between the centres of neighbouring patterns would be approximate to a straight line path between the centres of adjoining or neighbouring patterns. A smaller displacement is preferable as it permits more accurate positioning. A smaller angular displacement permits more accurate positioning. The manipulator array 34 comprises active elements which require wired connections for supply of power and control. Having a limited or small range of angular displacement decreases the risk of a continuous connection for all active elements of the manipulator array 34. A large angular displacement risks mechanical damage to the wired connection. A smaller angular displacement may avoid the need for mechanical switch of power, control or both.

Figure 9:
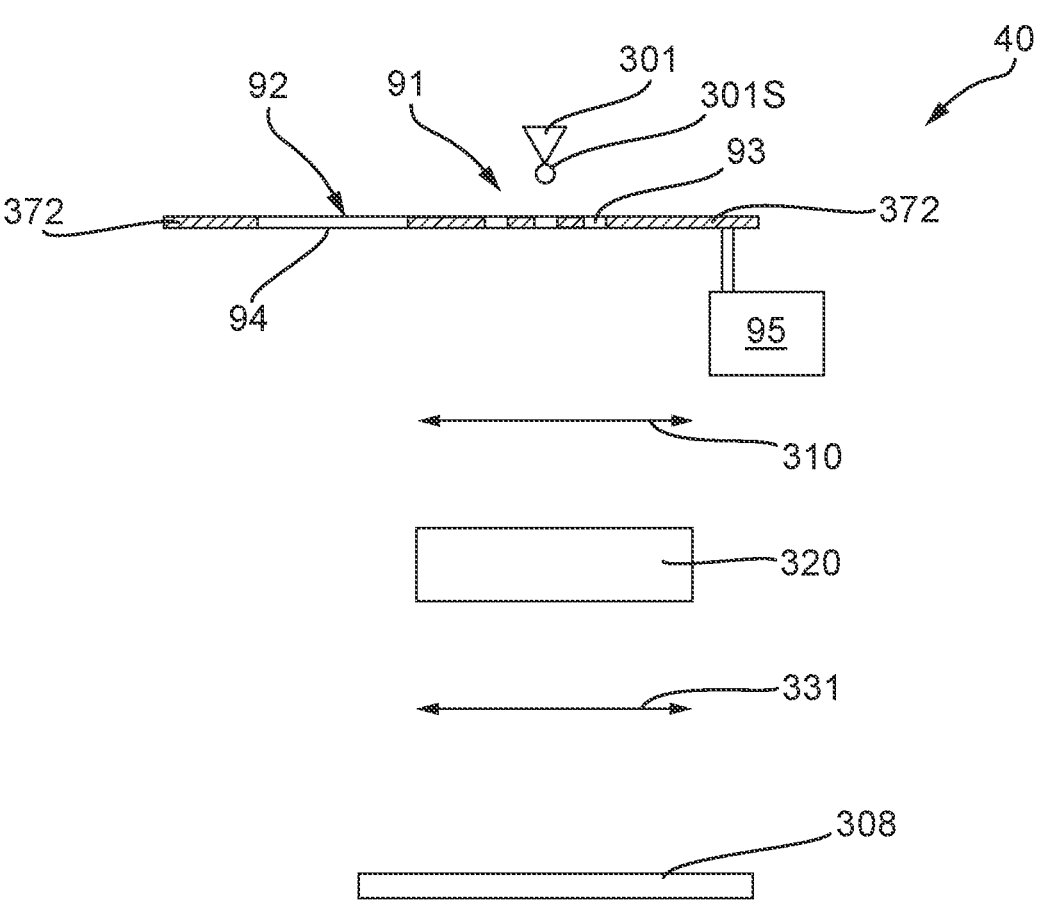
FIGS. 9 and 10 schematically depict different modes of operation of a charged particle column according to some embodiments of the present disclosure.

FIG. 9 is a schematic diagram of part of a charged particle column 40 according to some embodiments of the present disclosure. As depicted in FIG. 9, in an example, the charged particle column 40 comprises a beam former array 372. The beam former array 372 is the first element in the path of the primary beam 302 emitted by the electron source 301. The beam former array 372 is close to the source 301. The beam former array 372 is configured to control the current transmitted through the beam former array 372. In some embodiments, the beam former array 372 is up-beam of the condenser lens 310. In some embodiments, the condenser lens 310 is magnetic. As shown in FIG. 9, the beam former array 372 is up-beam of the source converter 320 and the beam-limiting aperture array 30 (not depicted). The beam limiting aperture array 30 may have a plurality of aperture patterns which may be switched, for example rotated and/or translated, as described elsewhere herein.

As shown in FIG. 9, in an example, the beam former array 372 comprises a plurality of different aperture patterns 91, 92. The aperture patterns 91, 92 defined in the beam former array 372 are configured to reduce the currents in the path down-beam of the beam former array 372. Reduction of the beam current can help reduce coulomb interactions between electrons such as in the multi-beam. The beam former array 372 thereby helps improve inspection performance.

In some embodiments, the aperture pattern 91 of the beam former array 372 is configured to separate the primary beam form the source 301 into a plurality of sub-beams. For example, as shown in FIG. 9 one of the aperture patterns 91 comprises three apertures 93. The aperture pattern 91 is configured to divide the primary beam 302 into three sub-beams. The primary beam is divided into sub-beams before the multi-beam reaches the beam-limiting aperture array 30. The beam limiting aperture 30 may at least shape the sub-beams for projecting towards the target 308. In an arrangement the beam limiting aperture array may generate from the sub-beams from the beam former array 372 sub-beams arranged in pattern corresponding to apertures in the beam limiting aperture array 30.

As shown in FIG. 9, in an example, another aperture pattern 92 is a single opening 94. When the aperture pattern 92 is a single opening 94, the primary beam may be retained as a single beam until it reaches the beam-limiting aperture array 30. The single opening 94 of the aperture pattern 92 may shape the beam; that is adjust the cross-section of the beam.

In some embodiments, the beam former array 372 comprises a plurality of aperture patterns 91, 92 provided on a strip. The aperture patterns 91, 92 may be arranged linearly along the strip, for example in a row. In an arrangement the strip may have two or more rows of linearly arranged aperture patterns 91, 92. In some embodiments, each aperture pattern 91, 92 has a different spacing, or pitch, between adjacent apertures and thereby different aperture pattern width. Each aperture pattern 91, 92 may have apertures of different dimensions, shape or both relative to each other and within the pattern. The strip may be moved, for example sequentially, to the change the aperture pattern 91, 92 in the beam path from the source; the strip movement may switch between the patterns that is used. An aperture pattern 91, 92 of appropriate dimensions may thereby be selected. Consideration of the dimensions of the aperture pattern 91, 92 and the strip may be made in view of the relative position of the required position of the aperture patterns in the beam path, for example relative to the source, beam-limiting aperture array 30 and/or the condenser lens arrangement 310.

In some embodiments, the beam former array 372 is shiftable. As shown in FIG. 9, in an example, the charged particle column comprises a mover 95. The mover 95 is configured to move, or shift, the beam former array 372 relative to the beam path from the source so as to switch between different modes of operation. The modes of operation may correspond to the different aperture patterns 91, 92 defined in the beam former array 372.

There are different ways in which the mover 95 may be configured to move the beam former array 372. The different possibilities are the same as the different possibilities for the mover 33 to move the beam-limiting aperture array 30 as described above. For example, the mover 95 comprises a rotator configured to rotate the beam former array 372 so as to switch which aperture pattern 91, 92 is in the path of charged particles emitted from the source 301. The rotator may be operable to rotate the beam formed array as described herein for rotating the beam limiting aperture array 30. Additionally or alternatively the mover 95 may be configured to translationally move the beam former array 372 so as to control which aperture pattern 91, 92 is in the path of charged particles. For a beam former array 372 as a strip, the mover may linearly move the strip between positions in which a different pattern is in the path of charged particles. The beam former array 372 may move at about the same time, even synchronously, with the beam limiting aperture array.

Figure 10:
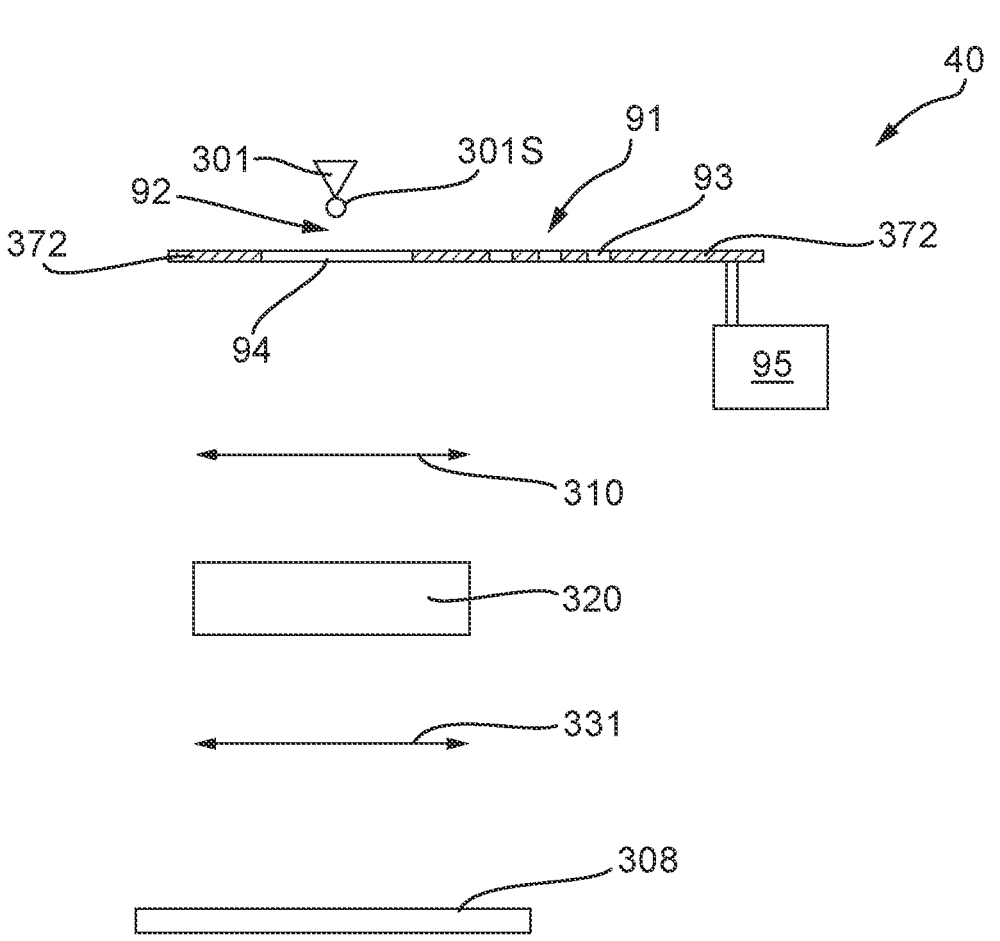

FIG. 10 schematically depicts the charged particle column 40 of FIG. 9 in a different mode of operation from that depicted in in FIG. 9. In the arrangement of FIG. 10 the aperture pattern 92 having the single opening 94 is in the path of charged particles. In order to transition from the mode shown in FIG. 9 to the mode shown in FIG. 10, the mover 95 moves the beam former array 372.

In the example shown in FIGS. 9 and 10, the beam former array 372 comprises an aperture pattern 91 configured to divide the primary beam into a plurality of sub beams and another aperture pattern 92 that does not split the primary beam. In an alternative example, the beam former array 372 comprises a plurality of aperture patterns each of which separates the primary beam. For example, the aperture pattern 91 comprises three apertures 93, and another aperture pattern defined in the same beam former array 372 comprises two apertures. In an alternative example, the number of apertures in different aperture patterns defined in the beam former array 372 may be the same as each other. The apertures 93 of the different aperture patterns 91, 92 may have different diameters, shapes and/or different pitches.

Figures 11, 12:
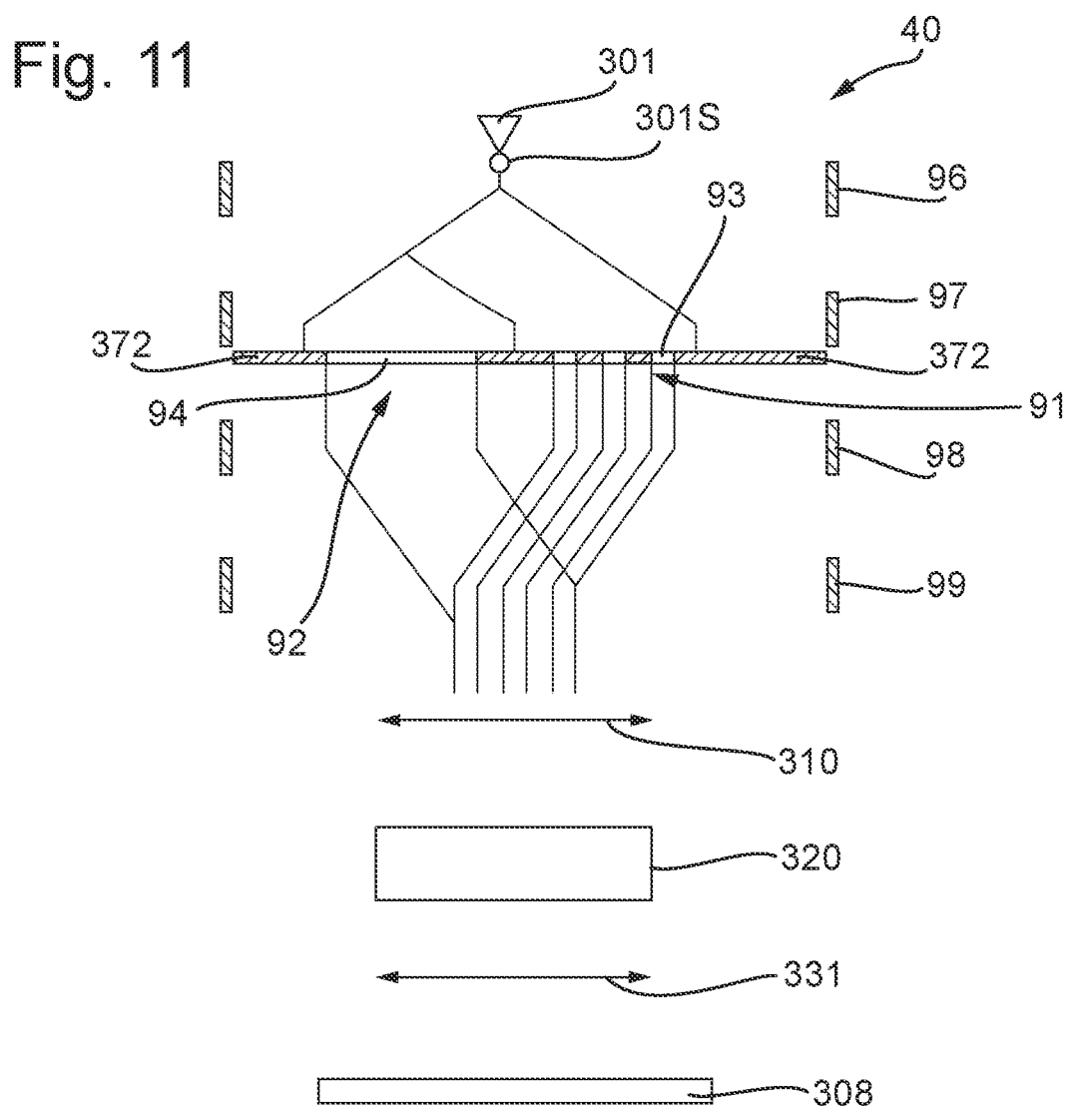
FIG. 11 schematically depicts a charged particle column capable of different modes of operation according to some embodiments of the present disclosure.
FIGS. 12 and 13 schematically depict different modes of part of a charged particle column according to some embodiments of the present disclosure.

FIG. 11 is a schematic diagram of a charged particle column 40 according to some embodiments of the present disclosure. As shown in FIG. 11, in an example, the charged particle column 40 comprises a beam former array 372. The beam former array 372 may comprise a plurality of aperture patterns 91, 92. In the example shown in FIG. 11, one of the aperture patterns 91 comprises three apertures 93 while the other aperture pattern 92 comprises a single aperture 94. However, the single aperture 94 is only one example of a possible aperture pattern. In an alternative example the aperture pattern 92 may comprise a plurality of apertures, for example the same number of apertures as in the other aperture pattern 91. The multi-aperture patterns of the beam-former array may have similar pitches between patterns. As shown in FIG. 11, in an example, the charged particle column 40 is configured to be operated in different modes corresponding to the different aperture patterns 91, 92 defined in the beam former array 372.

As shown in FIG. 11 in the example the charged particle column 40 comprises deflectors 96 to 99 configured to deflect charged particles selectively to the different aperture patterns 91, 92 so as to switch between the different modes. Both of the possible paths of charged particles are shown in FIG. 11. Deflection to such an aperture pattern may deflect the path of charged particles away from the electron-optical axis of the charged particle column 40. As shown in FIG. 11, in an example, the charged particle column 40 comprises a first pair of deflectors 96. The first pair of deflectors 96 is configured to deflect the primary beam emitted from the source 301 towards one or the aperture patterns 91, 92 defined in the beam former array 372. In some embodiments, the charged particle column 40 comprises a second pair of deflectors 97. The second pair of deflectors 97 is configured to deflect the beam so as to follow the direction of the electron-optical axis 304 of the charged particle column 40 (i.e. the direction of the beams are co-parallel to the electron-optical axis 304). The first pair of deflectors 96 and the second pair of deflectors 97 are disposed up-beam of the beam former array 372. The beam former array 372 is the first element in the path of the primary beam emitted by the source 301. Although the first pair of deflectors 96 and the second pair of deflectors 97 operate on the charged particles up-beam of the beam former array 372, they are away from the path of the primary beam; that is the first pair of deflectors 96 and the second pair of deflectors 97 are not in the path of the primary beam. Instead, they are radially outward of the path of the primary beam.

As show in FIG. 11, in an example, the charged particle column 40 comprises a third pair of deflectors 98. The third pair of deflectors 98 is configured to deflect the beam or sub-beams transmitted through the beam former array 372 towards the electron-optical axis 304 of the charged particle column 40. In some embodiments, the charged particle column 40 comprises a fourth pair of deflectors 99. The fourth pair of deflectors 99 is configured to deflect the beam or sub-beams to be directed to be parallel to the electron-optical axis 304 of the charged particle column 40. The third pair of deflectors 98 and the fourth pair of deflectors 99 are positioned down-beam of the beam former array 372. In some embodiments, the third pair of deflectors 98 and the fourth pair of deflectors 99 are positioned up-beam of the condenser lens 310. The third pair of deflectors 98 and the fourth pair of deflectors 99 are positioned up-beam of the beam-limiting aperture array 30.

The arrangement shown in FIG. 11 is only one example of how the deflectors may be arranged so as to selectively control selection of the aperture pattern 91, 92 of the beam former array 372 into the path of charged particles; that is which aperture pattern 91, 92 of the beam former array 372 is used. Other configurations are possible. For example, deflectors may be provided in groups of three or more rather than in pairs, so long as the net dispersion contribution is minimised as described in EP Application Serial No. 20189242.9, the relevant portions of the description hereby incorporated by reference.

FIG. 11 shows how deflectors may be used to deflect the multi-beam so as to select which aperture pattern 91, 92 of a beam former array 372 may be used. A similar arrangement of deflectors may be used so as to select which aperture pattern 31, 32 of a beam-limiting aperture array 30 may be used. This is not depicted in the figures. As an example, two pairs of deflectors may be positioned up-beam of the beam-limiting array 30 so as to deflect the multi-beam towards the selected aperture pattern 31, 32. Two further pairs on deflectors may be positioned down-beam of the beam-limiting aperture array 30 so as to deflect the multi-beam centrally within the charged particle column 40 towards the target 308 via the objective lens 331. The use of deflectors may be in addition to, or in replacement of the mover 33, to select which aperture pattern 31, 22 of the beam limiting aperture is in the path of charged particles. Use of a deflector to shift the beam between different patterns may be used, perhaps in combination with a mover, to select an aperture pattern from a beam-limiting aperture array defined as a strip along which the patterns are arranged.

FIG. 12 is a schematic diagram of part of a charged particle column 40 according to some embodiments of the present disclosure. As depicted in FIG. 12, in an example, the charged particle column 40 comprises a beam-limiting aperture array 30. The beam-limiting aperture array 30 comprises a plurality of different aperture patterns 31, 32. This is similar to as described above in relation to FIG. 3. In the example shown in FIG. 12 the mover 33 is configured to move the beam-limiting aperture array 30 relative to the manipulator array 34. The manipulator array 34 shown in FIG. 12 may comprise only one manipulator pattern comprising lenses 37 and deflectors 38. The manipulator pattern of the manipulator array 34 remains in the path of charged particles regardless of which aperture pattern 31, 32 of the beam-limiting aperture array 30 is in the path of charged particles. However, when a flooding aperture pattern 41 is selected, the manipulator array 34 may be moved (e.g. actuated) so that it is out of the beam path. Alternatively, when a flooding aperture pattern 41 is selected, the manipulator array 34 may be replaced in the beam path by a flooding manipulator array. As the same manipulator array 34 is used for each aperture pattern 31, 32, the apertures of the manipulator array and the aperture patterns 31, 32 share a common pitch. If an aperture pattern is selected such that the pitch between apertures changes, then the manipulator array 34 may be moved (e.g. actuated) so that it is out of the beam path or may be replaced by another manipulator array having the appropriate pitch between manipulators.

Figure 13:
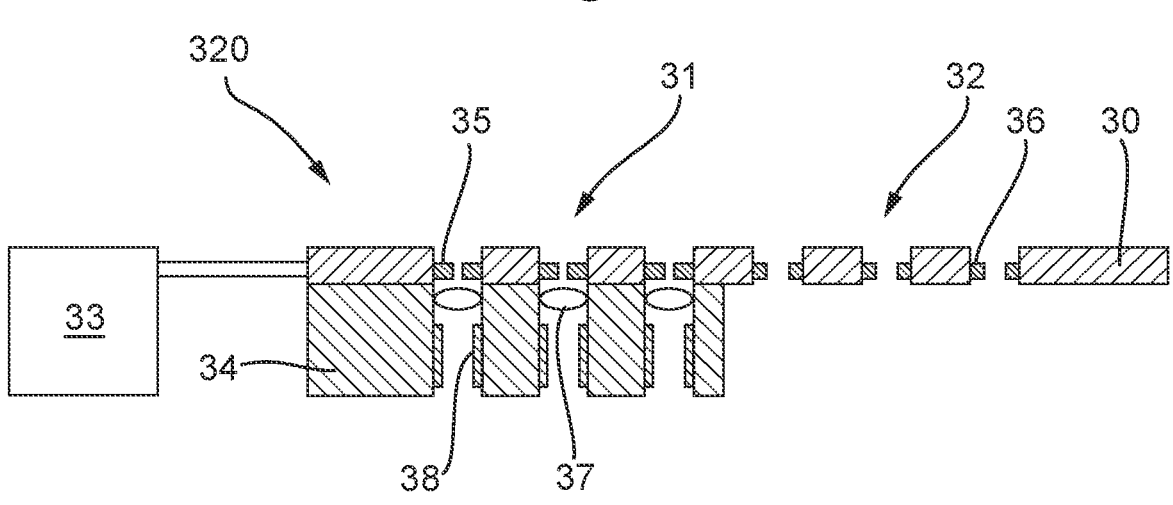

There are different ways in which the mover 33 may be configured to move the beam-limiting aperture array 30. In some embodiments, the mover 33 comprises a rotator configured to rotate the beam-limiting aperture array 30 relative to the manipulator array 34. The rotator and the beam limiting aperture array 30 may arranged to achieve any type of rotation of the beam limiting aperture array 30 described herein in context of rotating the beam limiting aperture array 30 with the associated electron-optical elements, except without the associated electron-optical elements. Rotation may be of the beam limiting aperture array 30 relative to the associated electron optical elements such as manipulators such as lenses and/or deflectors. Additionally or alternatively the mover 33 may be configured to translationally move the beam-limiting aperture array 30 relative to the manipulator array 34. For example, in the orientation of FIG. 12 the mover 33 may move the beam-limiting array 30 translationally to the right. FIG. 13 shows the result of the movement, namely that the other aperture pattern 31 of the beam-limiting aperture array becomes aligned with the manipulator pattern of the manipulator array 34. The selected aperture pattern 31, 32 of the beam-limiting aperture 30 is aligned with the manipulator pattern of the manipulator array 34 only when the selected aperture pattern 31, 32 is in the path of charged particles.

By providing that the beam-limiting aperture array 30 moves relative to the manipulator array 34, only a single set of manipulators such as lens 37 and deflectors 38 is required to be provided. Such examples are expected to reduce the cost of manufacturing the charged particle column 40 while making it possible to use different aperture patterns 31, 32.

In general, it may be simpler to provide different aperture patterns 31, 32 within the beam-limiting aperture array 30 than it is to provide different manipulator patterns within the manipulator array 34. By providing that the beam-limiting aperture array 30 moves relative to the manipulator array 34, there are fewer constraints on how the different aperture patterns 31, 32 are defined in the beam-limiting aperture array 30. In some embodiments, the pitch is common to the aperture patterns and the manipulator array 34.

Figure 14:
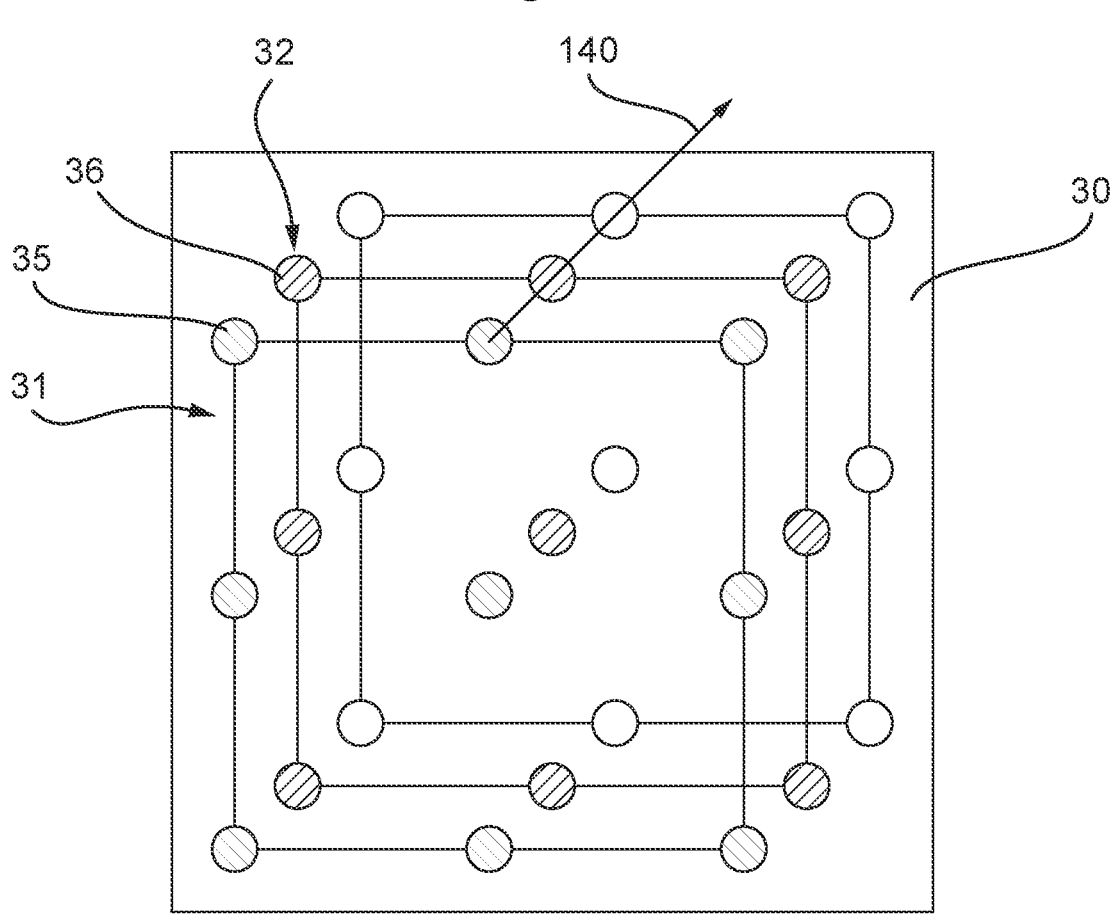
FIG. 14 schematically depicts a beam-limiting aperture array according to some embodiments of the present disclosure.

FIG. 14 schematically depicts a beam-limiting aperture array 30 according to some embodiments of the present disclosure. The beam-liming aperture array 30 comprises three different aperture patterns 31, 32. As shown in FIG. 14, in an example, the different aperture patterns 31, 32 are interleaved. The area over which the apertures 35 of one aperture pattern 31 overlaps with the area over which the apertures 36 of another aperture 36 extend. At least one aperture 35 of one aperture pattern 31 is positioned between apertures 36 of another of the aperture patterns 32. By interleaving the aperture patterns 31, 32 the size of the beam-limiting array 30 may be reduced. By interleaving the aperture patterns 31, 32, the distance by which the beam-limiting aperture array 30 needs to be moved in order to select a different aperture pattern can be reduced. Alternatively, the distance between which the path of charged particles, which may be a multi-beam, is required to be deflected in order to select the aperture pattern is reduced. At least some embodiments of the present disclosure are expected to speed up the switching between different modes of the charged particle column 40. Note that if the path of charged particle beam incident on this arrangement of aperture patterns is incident on the apertures of more than one aperture pattern, then an additional element or plate (not depicted) may be required either directly up-beam or down beam of the beam-limiting aperture array 30. The additional element may have a pattern corresponding to that of the interleaved pattern with apertures. The apertures are large enough to be used with each pattern of the beam-limiting aperture array 30. The additional element is stationary with respect to the path of charged particles; that is the additional element not moved with the beam-limiting aperture array. The function of the additional element is to prevent any sub-beams being generated from apertures of unselected aperture patterns. Thus the sub-beams down-beam of the beam-limiting aperture array 30 (or of the additional element if the additional element is down-beam of the beam-limiting aperture array 30) are only those shaped or generated by the selected pattern. The additional element may be considered as a blanker of sub-beams for unselected apertures and patterns.

In some embodiments, the charged particle column 40 comprises one or more blockers. A blocker is configured to prevent a beam or sub-beam or beamlet of charged particles from reaching the target 308. In some embodiments, a blocker comprises a deflector and an absorber. The deflector is configured to deflect the sub-beams or beamlets to the absorber where they are absorbed.

For example, a blocker is configured to block the sub-beam transmitted by one or more aperture patterns 91, 92 of the beam former array 372. A plurality of the aperture patterns 91, 92 of the beam former array 372 may be in the path of charged particles. The sub-beams transmitted by one or more of the aperture patterns 91, 92 may be blocked. In some embodiments, a blocker is configured to block the beamlets transmitted by one or more aperture patterns 31, 32 of the beam-limiting aperture array 30. A plurality of the aperture patterns 31, 32 of the beam-limiting aperture array 30 may be in the path of charged particles. The beamlets transmitted by one or more of the aperture patterns 31, 31 may be blocked.

As shown in FIG. 14, in an example, the apertures 35, 36 of different aperture patterns 31, 32 have the same pitch. A shown in FIG. 14, in an example, correspondingly positioned apertures of different apertures patterns may be positioned in the same direction relative to each other. For example, in the orientation shown in FIG. 14 of the relative displacement between the top middle aperture of all three apertures patterns are disposed in the same direction indicated by the arrow 140. By providing that the relative displacement of the apertures of different aperture patterns extend in the same direction, the beam-limiting aperture array 30 only needs to be movable in one direction (and the reverse direction) in order to switch between aperture patterns 31, 32; that is the beam-limiting aperture array 30 need only be moved along a path between the different interleaved patterns so as to select a pattern. The direction may be translational or rotational. If the direction is translational, then the correspondingly positioned apertures of different aperture patterns 31, 32 may be positioned in a straight line (when viewed along the electron-optical axis 304); the path may be linear. If the direction is rotational, then the correspondingly positioned apertures of the different aperture patterns 31, 32 may be placed on the same arc. The path may be curved such as an arcuate path. The arcuate path may have a relatively large angle of curvature, that is for example substantially straight. The beam-limiting aperture array 30 is required to be rotated around one axis to select which aperture pattern 31, 32 is in the path of charged particles. The rotational axis may be remote from the interleaved pattern. The axis of rotation may be towards the edge or even at the edge of the beam limiting aperture array 30. The beam limiting aperture array may have a planar shape with a corner. The axis of rotation may be towards or even at the corner of the beam limiting aperture array. The axis of rotation may be displaced further from the patterns than the distance between patterns. The axis of rotation may be remote from the beam limiting aperture array. The rotator may be connected to the beam limiting aperture array 30 remote from the axis of rotation. The rotator may be configured to rotate the beam limiting aperture array 30 around an axis of rotation away or distant from the beam limiting aperture array 30. A relatively remote axis may mean the rotational displacement between the different patterns is small. A small displacement between patterns may mean use of a smaller actuator in the mover 33. A small displacement such as of a single element may mean relatively quick selection of a pattern and may mean high positional accuracy of the selected aperture relative to the path of charged particles.

FIG. 14 shows the aperture patterns 31, 32 of the beam-limiting aperture array 30 interleaved with each other. In some embodiments, such a beam-limiting aperture array 30 is configured to be moved relative to the manipulator array 34. Accordingly, a single manipulator pattern may be provided so as to align with whichever of the aperture patterns 31, 32 is selected for the beam-limiting aperture array 30. It is not necessary to interleave the manipulator patterns. At least some embodiments are expected to make it simpler to manufacture the charged particle column 40 while allowing different aperture patterns 31, 32 to be selected.

In an alternative example, the beam-limiting aperture array 30 having interleaved aperture patterns 31, 32 is configured to move together with the manipulator array 34. The manipulator patterns may be interleaved in a similar manner to the aperture patterns 31, 32. The manipulator patterns remain aligned with their corresponding aperture patterns 31, 32.

In some embodiments, a beam former array 272 is provided in which the aperture patterns 91, 92 are interleaved. For example, different aperture patterns 91, 92 of the beam former array 372 may be interleaved in a similar manner to as shown in FIG. 14 for the beam-limiting aperture array 30.

As shown in FIG. 14, in an example, the beam-limiting aperture array 30 is configured such that the different aperture patterns 31, 32 can be selected by movement by beam-limiting aperture array 30 in one degree of freedom. In a similar manner, the different aperture patterns 91, 92 of a beam former array 372 may be arranged such that the different aperture patterns 91, 92 can be selected by movement of the beam former array 372 in one degree of freedom. In some embodiments, such a beam former array with interleaved aperture patterns may have an additional element or plate to blank charged particle sub-beams generated through apertures of an unselected pattern.

The above-described embodiments can be combined with each other. For example, in some embodiments, the charged particle column 40 comprises at least two aperture arrays 30, 372 which are operable to swap between aperture patterns simultaneously. For example, in some embodiments, the aperture arrays include a beam-limiting aperture array 30 and a beam former array 372. One of the aperture patterns 91, 92 of the beam former array 372 is selected to be in the path of charged particles. Down-beam of the beam former array 372, one of the aperture patterns 31, 32 of the beam-limiting aperture array 30 is selected to be in the path of charged particles. In some embodiments, each aperture pattern 31, 32 of the beam-limiting aperture array 30 is configured to combine with one of the aperture patterns 91, 92 of the beam former array 372 in a mode of projection.

As explained above there are different ways for selecting one aperture pattern of an aperture array. For example, deflectors may be used to deflect the beam or sub-beams to the selected aperture pattern. Additionally or alternatively, a mover may be configured to move the aperture array so as to position the selected aperture pattern in the pack of charged particles. Such a mover may move the aperture rotationally and/or translationally. The same or different methods for selecting the aperture array may be used for the beam former array 372 and the beam-limiting aperture array 30.

For an example, in an example, the beam former array 372 is configured to be rotated by a rotator (e.g. the mover 95 shown in FIG. 9) and the beam-limiting aperture array 30 may be rotated (e.g. by the mover 33 shown in FIG. 3). In an alternative example, the beam former array 372 is configured to be rotated and the beam-limiting aperture array 30 is configured to be moved translationally. In an alternative example, the beam former array 372 is configured to be rotated and deflectors are provided to deflect the sub-beam(s) through the selected aperture pattern 31, 32 of the beam-limiting aperture array 30.

In a further alternative example, the beam former array 372 is configured to be moved translationally and the beam-limiting aperture array 30 is configured to be rotated. In an alternative example the beam-limiting array 372 is configured to be moved translationally and the beam-limiting aperture array 30 is configured to be moved translationally. In an alternative example, the beam former array 372 is configured to be moved translationally and deflectors are provided to deflect the sub-beam(s) to the selected aperture pattern 31, 32 of the beam-limiting aperture array 30. In a yet further alternative example, deflectors 96 to 99 are provided to deflect the primary beam to the selected aperture pattern 91, 92 of the beam former array 372 and the beam-limiting aperture array 30 is configured to be rotated. In an alternative example deflectors 96 to 99 are provided to deflect the primary beam to the selected aperture pattern 91, 92 of the beam former array 372 and the beam-limiting aperture array 30 is configured to be moved translationally. In an alternative example deflectors 96 to 99 are provided to deflect the primary beam to the selected aperture pattern 91, 92 of the beam former array 272 and further deflectors are provided to deflect the sub-beams to the selected aperture pattern 31, 32 of the beam-limiting aperture array 30.

In some embodiments, selection of the different aperture patterns in each of the beam-limiting aperture array and the beam former array may synchronised and even simultaneous. In an arrangement the mover for each of the beam-limiting aperture array and the beam former array have interlinked controllers, may be the same controller or even the mover may be the same. In some embodiments, the selection of the aperture pattern 91, 92 of the beam former array 372 is performed in synchronisation with the selection of the aperture pattern 31, 32 of the beam-limiting aperture array 30. In some embodiments, the different aperture patterns 31, 32 of the beam-limiting aperture array 30 have different numbers of apertures. In some embodiments, the aperture pattern 91, 92 of the beam former array 372 is selected depending on the number of apertures in the selected aperture pattern 31, 32 of the beam-limiting aperture array 30.

In some embodiments of the present disclosure, one or more of the beam-limiting aperture array 30, the beam former array 372 and the micro-optics are replaceable, preferably field replaceable.

By switching between different modes, the performance of the charged particle column 40 is improved. For example, the resolution for a given-probe current can be improved by switching between different aperture patterns 31, 32 having different diameters of aperture 35, 36.

The charged particle column 40 may be a component of an inspection (or metro-inspection) tool or part of an e-beam lithography tool. The multi-beam charged particle apparatus may be used in a number of different applications that include electron microscopy in general, not just SEM, and lithography.

Throughout embodiments an electron-optical axis 304 is described. This electron-optical axis 304 describes the path of charged particles through and output from the source 301. The sub-beams and beamlets of a multi-beam may all be substantially parallel to the electron-optical axis 304. The electron-optical axis 304 may be the same as, or different from, a mechanical axis of the charged particle column 40.

While the embodiments of the present disclosure have been described in connection with various examples, other embodiments will be apparent to those skilled in the art from consideration of the specification and practice of the technology disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims and clauses set out below.

There are provided a number of clauses:

Clause 1: A multi-beam charged particle column configured to project a multi-beam of charged particles towards a target, the multi-beam charged particle column comprising: at least one aperture array comprising at least two different aperture patterns; and a rotator configured to rotate the aperture array between the different aperture patterns; or at least one aperture array comprising at least two different aperture patterns and a rotator configured to rotate the at least one aperture array between the different aperture patterns along an arcuate path about an rotational axis remote from the respective patterns of the at least one aperture array. Preferably the rotational axis is further from the patterns of the at least one aperture array than the patterns are from each other. Preferably the rotational axis is remote from the aperture array; or preferably the rotational axis towards an edge of the at least one aperture array.

Clause 2: The multi-beam charged particle column of clause 1, wherein the at least one aperture array comprises a beam-limiting aperture array, the aperture patterns being configured to shape beamlets of the multi-beam projected towards the target.

Clause 3: The multi-beam charged particle column of clause 2, further comprising: a manipulator array comprising at least one manipulator pattern aligned with the aperture pattern of the beam-limiting aperture array in the path of charged particles so as to operate on the beamlets projected towards the target.

Clause 4: The multi-beam charged particle column of clause 3, wherein the rotator is configured to rotate the beam-limiting aperture array together with the manipulator array.

Clause 5: The multi-beam charged particle column of clause 3, wherein the rotator is configured to rotate the beam-limiting aperture array relative to the manipulator array.

Clause 6: The multi-beam charged particle column of any preceding clause, wherein the at least one aperture array comprises a beam former array being the first element in the path of a primary beam emitted by a charged particle source, the aperture patterns defined in the beam former array configured to reduce the current in the path down-beam of the beam former array, optionally the beam former array being configured to separate the primary beam into a plurality of beams, optionally the beam former array being up-beam of a condenser lens which preferably is magnetic.

Clause 7: The multi-beam charged particle column of any preceding clause, wherein at least two of the aperture arrays are operable to swap between aperture patterns in each array simultaneously, preferably the aperture arrays including a beam-limiting aperture array and a beam former array.

Clause 8: The multi-beam charged particle column of any preceding clause, wherein one of the aperture patterns comprises a flooding aperture pattern, optionally wherein the flooding aperture pattern is a single opening.

Clause 9: The multi-beam charged particle column of any preceding clause, wherein the aperture patterns are interleaved.

Clause 10: The multi-beam charged particle column of any preceding clause, wherein the rotator is configured to rotate the aperture array so as to switch between different modes of the multi-beam charged particle column corresponding to the different aperture patterns.

Clause 11: A multi-beam charged particle column configured to project a multi-beam of charged particles towards a target, the multi-beam charged particle column comprising: a beam former array comprising at least two different aperture patterns, the beam former array being the first element in the path of a primary beam emitted by a charged particle source, the aperture patterns defined in the beam former array configured to reduce the current in the path down-beam of the beam former array; and a beam-limiting aperture array down-beam of the beam former array; wherein the different aperture patterns of the beam former array are configured to be selectable.

Clause 12: The multi-beam charged particle column of clause 11, further comprising: deflectors configured to deflect charged particles selectively to the different aperture patterns so as to select the different aperture patterns of the beam former array.

Clause 13: The multi-beam charged particle column of clause 11, further comprising: a mover configured to move the beam former array so as to select the different aperture patterns of the beam former array.

Clause 14: The multi-beam charged particle column of clause 13, wherein the mover comprises a rotator configured to rotate the beam former array so as to select the different aperture patterns of the beam former array.

Clause 15: The multi-beam charged particle column of clause 13 or 14, wherein the mover is configured to translationally move the beam former array so as to select the different aperture patterns of the beam former array.

Clause 16: The multi-beam charged particle column of any of clauses 13-15, wherein the aperture patterns are arranged such that the mover is configured to select the different aperture patterns of the beam former array by moving the beam former array in one degree of freedom.

Clause 17: The multi-beam charged particle column of any of clauses 11-16, wherein: the beam-limiting aperture array comprises at least two different aperture patterns configured to shape beamlets of the multi-beam projected towards the target; and, preferably, the different aperture patterns defined in the beam-limiting aperture array correspond to the different aperture patterns of the beam former array.

Clause 18: The multi-beam charged particle column of any of clauses 10-16, wherein one of the aperture patterns of the beam former array comprises a flooding aperture pattern, optionally wherein the flooding aperture pattern is a single opening.

Clause 19: A multi-beam charged particle column configured to project a multi-beam of charged particles towards a target, the multi-beam charged particle column comprising: a beam-limiting aperture array configured to shape beamlets of the multi-beam projected towards the target, the beam-limiting aperture array comprising at least two different aperture patterns, wherein one of the aperture patterns comprises a flooding aperture pattern; a manipulator array aligned with the beam-limiting aperture array and comprising at least one manipulator pattern configured to operate on the beamlets projected towards the target; and a mover configured to move the beam-limiting aperture array together with the manipulator array so as to switch between the different aperture patterns.

Clause 20: The multi-beam charged particle column of clause 19, configured such that when the flooding aperture pattern is moved into the path of charged particles, the manipulator pattern is moved out from the path of charged particles.

Clause 21: The multi-beam charged particle column of clause 19 or 20, further comprising: a beam former array comprising at least two different aperture patterns, the beam former array being the first element in the path of a primary beam emitted by a charged particle source, the aperture patterns defined in the beam former array configured to reduce the current in the path down-beam of the beam former array; and, optionally, wherein the different aperture patterns defined in the beam former array correspond to the different aperture patterns of the beam-limiting aperture array.

Clause 22: The multi-beam charged particle column of any of clauses 19-21, wherein the mover comprises a rotator configured to rotate the beam-limiting aperture array together with the manipulator array so as to switch between the different aperture patterns of the beam-limiting aperture array.

Clause 23: The multi-beam charged particle column of any of clauses 19-22, wherein the mover is configured to translationally move the beam-limiting aperture array together with the manipulator array so as to switch between the different aperture patterns of the beam-limiting aperture array.

Clause 24: The multi-beam charged particle column of any of clauses 19-23, wherein the aperture patterns defined in the beam-limiting aperture array are arranged such that the mover is configured to switch between the different aperture patterns of the beam-limiting aperture array by moving the beam-limiting aperture array together with the manipulator array in one degree of freedom.

Clause 25: The multi-beam charged particle column of any of clauses 19-24, wherein the aperture patterns defined in the beam-limiting aperture array are interleaved.

Clause 26: A multi-beam charged particle column configured to project a multi-beam of charged particles towards a target, the multi-beam charged particle column comprising: a beam-limiting aperture array comprising at least two different aperture patterns configured to shape beamlets of the multi-beam projected towards the target, wherein the different aperture patterns are interleaved; and a mover configured to move the beam-limiting aperture array so as to switch between the different aperture patterns.

Clause 27: The multi-beam charged particle column of clause 26, further comprising: a manipulator array comprising a manipulator array comprising a manipulator pattern aligned with the aperture pattern in the path of charged particles so as to operate on the beamlets projected towards the target.

Clause 28: The multi-beam charged particle column of clause 26 or 27, further comprising: deflectors configured to deflect charged particles selectively to the different aperture patterns so as to switch between the different aperture patterns.

Clause 29: The multi-beam charged particle column of any of clauses 26-28, wherein the mover comprises a rotator configured to rotate the beam-limiting aperture array so as to switch between the different aperture patterns.

Clause 30: The multi-beam charged particle column of any of clauses 26-29, wherein the mover is configured to translationally move the beam-limiting aperture array so as to switch between the different aperture patterns.

Clause 31: The multi-beam charged particle column of any of clauses 26-30, wherein the mover is configured to move the beam-limiting aperture array relative to the manipulator array so as to switch between the different aperture patterns.

Clause 32: The multi-beam charged particle column of any of clauses 26-31, wherein the beam-limiting aperture array comprises a flooding aperture pattern.

Clause 33: The multi-beam charged particle column of any of clauses 26-32, wherein the interleaved patterns are an array of openings of common pitch.

Clause 34: The multi-beam charged particle column of any of clauses 26-33, wherein there are at least three interleaved patterns which are shiftably selectable along a common path.

Clause 35: A multi-beam charged particle column configured to project a multi-beam of charged particles towards a target, the multi-beam charged particle column comprising: a beam-limiting aperture array comprising at least three different aperture patterns configured to shape beamlets of the multi-beam projected towards the target a manipulator array comprising a manipulator pattern configured to align with the aperture pattern in the path of charged particles and operate on the beamlets projected to the target; and a mover configured to move the beam-limiting aperture array in one degree of freedom relative to the manipulator array so as to switch between the different aperture patterns.

Clause 36: The multi-beam charged particle column of clause 35, wherein the mover comprises a rotator configured to rotate the beam-limiting aperture array so as to switch between the different aperture patterns.

Clause 37: The multi-beam charged particle column of clause 35 or 36, wherein the mover is configured to translationally move the beam-limiting aperture array so as to switch between the different aperture patterns.

Clause 38: The multi-beam charged particle column of any of clauses 35-37, wherein the aperture patterns are interleaved Clause 39: The multi-beam charged particle column of any preceding clause, wherein the different aperture patterns correspond to different sizes of aperture.

Clause 40: An aperture array for a multi-beam charged particle column configured to project a multi-beam of charged particles towards a target, the aperture array comprising a plurality of different aperture patterns, wherein: the aperture array is shiftable relative a manipulator array comprising a manipulator array configured to align with the aperture pattern in the path of charged particles; the different aperture patterns have the same pitch; and the different aperture patterns are interleaved.

Clause 41: The aperture array of clause 40, wherein in the aperture array are defined at least three aperture patterns arranged to be interchangeably selectable along a common path Clause 42: A method of projecting a multi-beam of charged particles to a target, the method comprising: rotating at least one aperture array comprising at least two different aperture patterns so as to switch between the different aperture patterns Clause 43: A method of projecting a multi-beam of charged particles to a target, the method comprising: emitting a primary beam of charged particles from a charged particle source; using a beam former array comprising at least two different aperture patterns, the beam former array being the first element in the path of the primary beam, the aperture patterns defined in the beam former array configured to reduce the current in the path down-beam of the beam former array; shaping beamlets of the multi-beam projected to the target using a beam-limiting aperture array down-beam of the beam former array; and switching between the different aperture patterns of the beam former array.

Clause 44: A method of projecting a multi-beam of charged particles to a target, the method comprising: using a beam-limiting aperture array comprising at least one aperture pattern to shape beamlets of the multi-beam projected to the target; using a manipulator array comprising at least one manipulator pattern aligned with the aperture pattern in the path of charged particles so as to operate on the beamlets projected to the target; and moving the beam-limiting aperture array together with the manipulator array so as to switch between said aperture pattern and another aperture pattern of the beam-limiting aperture array comprising a flooding aperture pattern Clause 45: A method of projecting a multi-beam of charged particles to a target, the method comprising: using a beam-limiting aperture array comprising at least two different aperture patterns to shape beamlets of the multi-beam projected to the target, wherein the different aperture patterns are interleaved; and moving the beam-limiting aperture array so as to switch between the different aperture patterns.

Clause 46: A method of projecting a multi-beam of charged particles to a target, the method comprising: using a beam-limiting aperture array comprising at least three different aperture patterns to shape beamlets of the multi-beam projected to the target; using a manipulator array comprising a manipulator array aligned with the aperture pattern in the path of charged particles to operate on the beamlets projected to the target; and moving the beam-limiting aperture array in one degree of freedom relative to the manipulator array so as to switch between the different aperture patterns.

Clause 47: A method of projecting a multi-beam of charged particles to a target, the method comprising: rotating a beam limiting aperture array comprising at least two different aperture patterns so as to switch between the different aperture patterns wherein the rotation is about a rotation axis remote from the at least two different aperture patterns.

Clause 48: The method of any of clauses 42, 43 to 47 further comprising: emitting a primary beam of charged particles from a charged particle source; using a beam former array, the beam former array being the first element in the path of the primary beam, the aperture patterns defined in the beam former array configured to reduce the current in the path down-beam of the beam former array; and shaping beamlets of the multi-beam projected to the target using the beam-limiting aperture array down-beam of the beam former array; and preferably switching between the different aperture patterns of the beam former array Clause 49: The method of clause 48 wherein the switching of the beam limiting aperture array and the switching between different aperture patterns of the beam former array is synchronous.

Clause 50: An aperture array configured for use in a multi-beam charged particle column for projecting a multi-beam of charged particles towards a target comprising at least two different aperture patterns, wherein the aperture array is configured to be rotatable between the different aperture patterns.

The invention claimed is:
1. A multi-beam charged particle column configured to project a multi-beam of charged particles towards a target, the multi-beam charged particle column comprising:

at least one aperture array comprising at least two different aperture patterns, wherein the at least two different aperture patterns comprises a flooding aperture pattern that is a single opening; and a rotator configured to rotate the at least one aperture array between the at least two different aperture patterns along an arcuate path about a rotational axis remote from aperture patterns of the at least one aperture array.

2. The multi-beam charged particle column of claim 1, wherein the at least one aperture array includes a beam-limiting aperture array configured to shape beamlets of the multi-beam projected towards the target.

3. The multi-beam charged particle column of claim 2, further comprising:

a manipulator array comprising at least one manipulator pattern aligned with an aperture pattern of the beam-limiting aperture array in a path of the charged particles so as to operate on the beamlets projected towards the target.

4. The multi-beam charged particle column of claim 3, wherein the rotator is configured to rotate the beam-limiting aperture array together with the manipulator array.

5. The multi-beam charged particle column of claim 3, wherein the rotator is configured to rotate the beam-limiting aperture array relative to the manipulator array.

6. The multi-beam charged particle column of claim 1, wherein:

the at least one aperture array includes a beam former array as a first element in a path of a primary beam emitted by a charged particle source; and aperture patterns defined in the beam former array are configured to reduce current in the path down-beam of the beam former array.

7. The multi-beam charged particle column of claim 6, wherein:

the beam former array is configured to separate the primary beam into a plurality of beams; and the beam former array is disposed up-beam of a condenser lens.

8. The multi-beam charged particle column of claim 1, wherein:

the at least one aperture array includes at least two aperture arrays; and the at least two aperture arrays are operable to swap between aperture patterns in each array simultaneously.

9. The multi-beam charged particle column of claim 1, wherein the at least two aperture patterns are interleaved.

10. The multi-beam charged particle column of claim 1, wherein the rotator is configured to rotate the at least one aperture array so as to switch between different modes of the multi-beam charged particle column corresponding to different ones of the at least two different aperture patterns.

11. The multi-beam charged particle column of claim 1, wherein the at least one aperture array includes:

a beam-limiting aperture array configured to shape beamlets of the multi-beam projected towards the target;

a manipulator array aligned with the beam-limiting aperture array and comprising at least one manipulator pattern configured to operate on the beamlets projected towards the target; and wherein the rotator is configured to move the beam-limiting aperture array together with the manipulator array so as to switch between different aperture patterns.

12. The multi-beam charged particle column of claim 11, wherein the at least one aperture array is configured such that, when the flooding aperture pattern is moved into a path of the charged particles, the manipulator pattern is moved out from the path of the charged particles.

13. The multi-beam charged particle column of claim 11, further comprising:

a beam former array comprising at least two different aperture patterns, wherein:

the beam former array is a first element in the path of a primary beam emitted by a charged particle source; and aperture patterns defined in the beam former array are configured to reduce the current in the path down-beam of the beam former array.

14. The multi-beam charged particle column of claim 13, wherein the at least two different aperture patterns of the beam former array correspond to the at least two different aperture patterns of the beam-limiting aperture array.

15. A multi-beam charged particle column configured to project a multi-beam of charged particles towards a target, the multi-beam charged particle column comprising:

a beam-limiting aperture array comprising at least three different aperture patterns configured to shape beamlets of the multi-beam projected towards the target;

a manipulator array comprising a manipulator pattern configured to align with an aperture pattern in a path of the charged particles and operate on the beamlets projected to the target; and a mover configured to move the beam-limiting aperture array in one degree of freedom relative to the manipulator array so as to switch between the at least three different aperture patterns, wherein the mover comprises a rotator configured to rotate the beam-limiting aperture array along an arcuate path about a rotational axis remote from aperture patterns of the beam-limiting aperture array so as to switch between the at least three different aperture patterns.

16. The multi-beam charged particle column of claim 15, wherein the mover is further configured to translationally move the beam-limiting aperture array so as to switch between the different aperture patterns.

17. The multi-beam charged particle column of claim 15, wherein the at least three aperture patterns are interleaved.

18. The multi-beam charged particle column of claim 15, wherein the at least three different aperture patterns correspond to different sizes of aperture.

19. A method of projecting a multi-beam of charged particles to a target, the method comprising:

rotating a beam-limiting aperture array comprising at least two different aperture patterns, one of the different aperture patterns comprising a flooding aperture pattern that is a single opening, so as to switch between the flooding aperture pattern and another aperture pattern of the different aperture patterns, wherein the rotating is performed about a rotation axis remote from the at least two different aperture patterns.

20. The method of claim 19, further comprising:

emitting a primary beam of charged particles from a charged particle source;

using a beam former array, the beam former array being a first element in path of the primary beam, aperture patterns defined in the beam former array configured to reduce current in the path down-beam of the beam former array; and shaping beamlets of the multi-beam projected to the target using the beam-limiting aperture array down-beam of the beam former array.

\* \* \* \* \*